US012757428B2

(12) United States Patent
Chu et al.

(10) Patent No.: US 12,757,428 B2
(45) Date of Patent: Oct. 6, 2026

(54) TRANSISTOR STRUCTURE AND METHODS OF FORMATION

(71) Applicant: Taiwan Semiconductor Manufacturing Company, Ltd., Hsinchu (TW)

(72) Inventors: Chen-Liang Chu, Hsin-Chu City (TW); Hsin-Chih Chiang, Hsinchu City (TW); Ruey-Hsin Liu, Hsin-Chu (TW); Ta-Yuan Kung, New Taipei City (TW); Ta-Chuan Liao, Taichung City (TW); Chih-Wen Yao, Hsinchu City (TW); Ming-Ta Lei, Hsin-Chu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 616 days.

(21) Appl. No.: 18/316,029

(22) Filed: May 11, 2023

(65) Prior Publication Data

US 2024/0379845 A1 Nov. 14, 2024

(51) Int. Cl.

| | |
|---|---|
| ***H10D 30/60*** | (2025.01) |
| ***H03K 3/356*** | (2006.01) |
| ***H03K 19/0185*** | (2006.01) |
| ***H10D 30/01*** | (2025.01) |

(52) U.S. Cl.

CPC ..... *H10D 30/601* (2025.01); *H03K 3/356113* (2013.01); *H03K 19/018521* (2013.01); *H10D 30/0227* (2025.01)

(58) Field of Classification Search

CPC ............. H10D 30/601; H10D 30/0227; H03K 3/356113; H03K 19/018521

See application file for complete search history.

(56) References Cited

U.S. PATENT DOCUMENTS 5,844,275 A * 12/1998 Kitamura ............. H10D 62/393 257/E29.066

6,548,874 B1 * 4/2003 Morton .................. H10D 84/85 257/E29.268

6,876,035 B2 * 4/2005 Abadeer .............. H10D 62/157 257/493

(Continued)

*Primary Examiner* — Eugene Lee

(74) *Attorney, Agent, or Firm* — Harrity & Harrity, LLP

(57) ABSTRACT

A medium voltage transistor of a level shifter circuit may include a p-well region in a substrate. Moreover, the medium voltage transistor may include an n-type lightly-doped source/drain (NLDD) region in which an $N^+$ source/drain region of the medium voltage transistor is included. The light doping in the NLDD region enables a threshold voltage (Vi) to be reduced while enabling medium voltage operation at the $N^+$ source/drain region. To reduce the amount of current leakage in the medium voltage transistor due to the light doping in the NLDD region, a buffer layer may be included over and/or on a portion of the NLDD region under a gate structure of the medium voltage transistor. The NLDD region and the thermal region of the medium voltage transistor enables the threshold voltage of the medium voltage transistor while maintaining the same current leakage performance or reducing current leakage in the medium voltage transistor.

20 Claims, 25 Drawing Sheets

(56) References Cited

U.S. PATENT DOCUMENTS

| | | | | |
|---|---|---|---|---|
| 7,101,764 | B2 * | 9/2006 | Petti | H10D 62/116 257/E21.345 |
| 7,145,203 | B2 * | 12/2006 | Wang | H10D 62/116 257/E29.054 |
| 8,067,289 | B2 * | 11/2011 | Park | H10D 30/65 438/137 |
| 9,472,511 | B2 * | 10/2016 | Lee | H01L 23/60 |
| 2006/0113627 | A1 * | 6/2006 | Chen | H10D 30/603 257/500 |
| 2006/0261408 | A1 * | 11/2006 | Khemka | H10D 8/411 257/E29.328 |
| 2007/0155143 | A1 * | 7/2007 | Choi | H10D 30/0221 257/E29.022 |
| 2007/0267693 | A1 * | 11/2007 | Chien | H10D 84/038 257/E29.054 |
| 2009/0140335 | A1 * | 6/2009 | Schneider | H10D 62/151 257/344 |
| 2009/0256199 | A1 * | 10/2009 | Denison | H10D 30/0281 257/E21.409 |
| 2011/0198690 | A1 * | 8/2011 | Hu | H10D 64/516 257/E29.256 |
| 2012/0193711 | A1 * | 8/2012 | Asano | H10D 89/713 257/E29.256 |
| 2013/0175616 | A1 * | 7/2013 | Min | H10D 30/655 257/339 |
| 2014/0001545 | A1 * | 1/2014 | Yang | H10D 30/0285 257/337 |
| 2015/0340428 | A1 * | 11/2015 | Lu | H10D 62/109 438/286 |
| 2022/0123142 | A1 * | 4/2022 | Yanagi | H10D 62/126 |

* cited by examiner

700

TRANSISTOR STRUCTURE AND METHODS OF FORMATION

BACKGROUND

A level shifter circuit is an electronic circuit that is configured to shifts an electronic signal from a first voltage level to a second voltage level. Numerous electron devices may include one or more level shifter circuits, such as a static random-access memory (SRAM) device, a driver integrated circuit in a panel driver of a display device, and/or an input/output (I/O) integrated circuit, among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
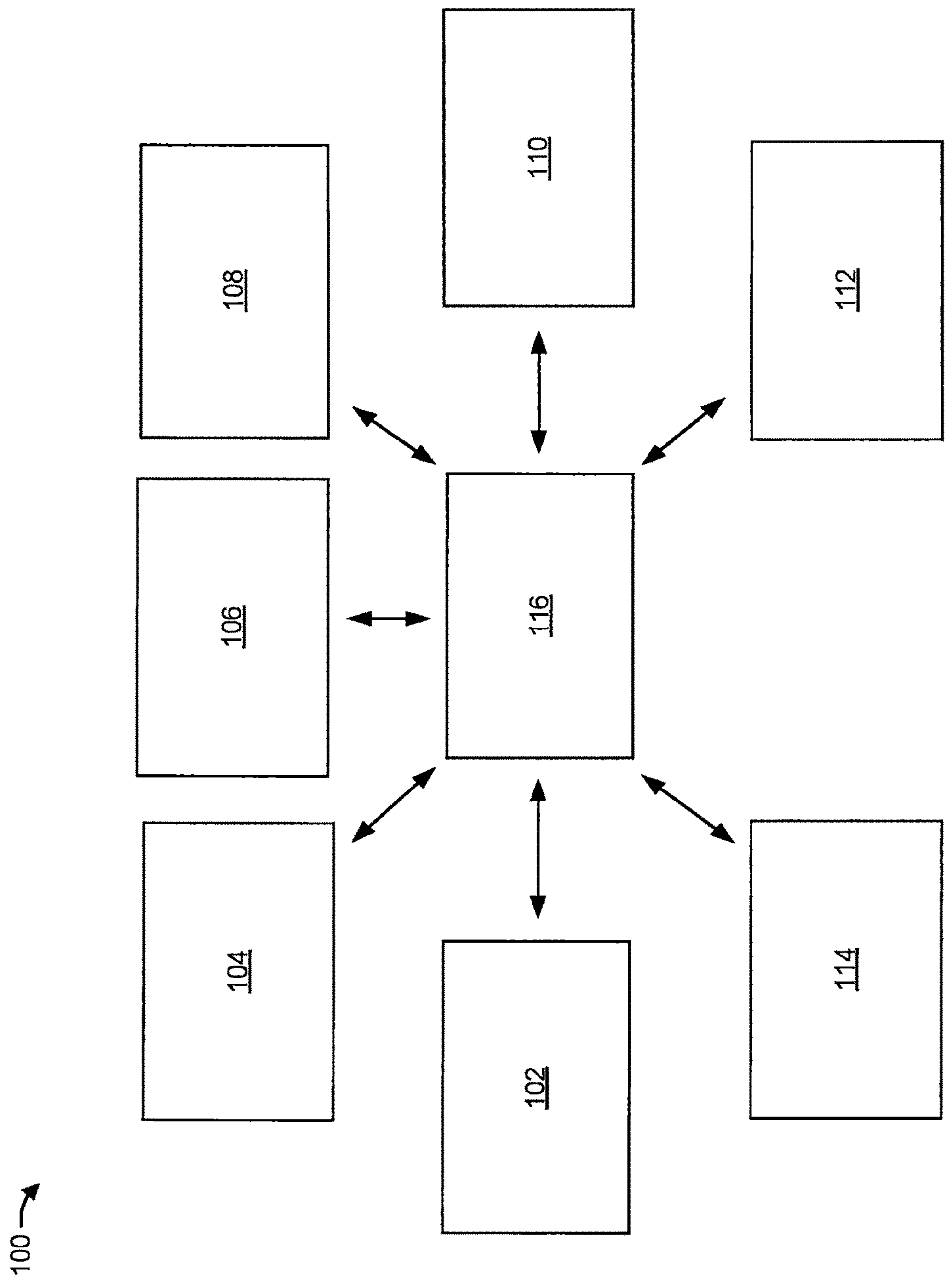
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A level shifter circuit may include a plurality of transistors, such as a combination of low voltage (LV) transistors and medium voltage (MV) transistors. Low voltage transistors are sometimes also referred to as core (or thin-gate) transistors and are configured to receive a low voltage input signal to the level shifter circuit. Medium voltage transistors are sometimes also referred to as I/O (or thick-gate) transistors and are configured to handle a medium voltage output signal of the level shifter circuit.

A medium voltage transistor in a level shifter circuit may include a gate oxide layer (e.g., a high temperature oxide (HTO) and/or another type of gate oxide) that has a sufficient thickness to support the medium voltages (e.g., 6 volts, 8 volts) handled by the medium voltage transistor. However, if the gate oxide layer is too thick, the medium voltage transistor may be unable to be operated by the low voltage (core $V_{dd}$) of the low voltage transistors because of the high threshold voltage ($V_t$) that is needed to tunnel electrons through the gate oxide layer. Reducing the dopant concentration in a well implant in which the channel of the medium voltage transistor is included may enable the threshold voltage to be reduced, but may increase current leakage (which may reduce device performance) for the medium voltage transistor.

In some implementations described herein, a medium voltage transistor of a level shifter circuit may include a p-well region in a substrate. Moreover, the medium voltage transistor may include an n-type lightly-doped source/drain (NLDD) region in which an $N^+$ source/drain region of the medium voltage transistor is included. A source/drain region may refer to a source or a drain, individually or collectively dependent upon the context. The light doping in the NLDD region enables a threshold voltage (Vi) to be reduced while enabling medium voltage operation at the $N^+$ source/drain region. To reduce the amount and/or likelihood of current leakage in the medium voltage transistor due to the light doping in the NLDD region, a buffer layer may be included over and/or on a portion of the NLDD region under a gate structure of the medium voltage transistor.

In this way, the NLDD region and the thermal region of the medium voltage transistor enables the threshold voltage of the medium voltage transistor (e.g., relative to a medium voltage transistor that does not include the NLDD region and the thermal region) while maintaining the same current leakage performance or reducing current leakage in the medium voltage transistor (e.g., relative to a medium voltage transistor that does not include the NLDD region and the thermal region). This may enable the medium voltage transistor may be operated by the low voltage (core $V_{dd}$) of low voltage transistors included in the level shifter circuit. Moreover, this may enable the low voltage of the low voltage transistors included in the level shifter circuit to be reduced, which may reduce the power consumption of the level shifter circuit.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The wafer/die transport tool 116 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-114 and/or the wafer/die transport tool 116 may perform one or more semiconductor processing operations described herein. For example, one or more of the semiconductor processing tools 102-114 and/or the wafer/die transport tool 116 may form, over a substrate, a first doped region of a semiconductor device, where the first doped region includes a first dopant type; may form, in the first doped region, a second doped region of the semiconductor device, where the second dope region includes a second dopant type; may form, over the second doped region, a buffer layer of the semiconductor device; may form, over the first doped region, over the second doped region, and over the buffer layer, a gate oxide layer of the semiconductor device; and/or may form, over the gate oxide layer, a gate structure of the semiconductor device, among other examples. As another example, one or more of the semiconductor processing tools 102-114 and/or the wafer/die transport tool 116 may form a masking layer over the first doped region and over the second doped region; may form a pattern in the masking layer; and/or may form the buffer layer based on the pattern in the masking layer, among other examples. As another example, one or more of the semiconductor processing tools 102-114 and/or the wafer/die transport tool 116 may etch a portion of the second doped region based on the pattern; and/or may deposit the buffer layer in an area that was occupied by the portion of the second doped region, among other examples. As another example, one or more of the semiconductor processing tools 102-114 and/or the wafer/die transport tool 116 may perform one or more etch operations, based on the gate structure, to remove a first portion of the gate oxide layer and to remove a first portion of the buffer layer, where a second portion of the gate oxide layer remains under the gate structure, and where a second portion of the buffer layer remains under the gate structure, among other examples. As another example, one or more of the semiconductor processing tools 102-114 and/or the wafer/die transport tool 116 may perform an etch operation to remove the masking layer, where the etch operation results in a top surface of the buffer layer and a top surface of the first doped region being approximately coplanar, among other examples.

As another example, one or more of the semiconductor processing tools 102-114 and/or the wafer/die transport tool 116 may dope a substrate with a first dopant type to form a first doped region of a semiconductor device; may dope the substrate with a second dopant type to form a second doped region of the semiconductor device adjacent to the first doped region; may form, on the second doped region, a buffer layer of the semiconductor device; may form, over the first doped region, over the second doped region, and over the buffer layer, a gate oxide layer of the semiconductor device; and/or may form, over the gate oxide layer, a gate structure of the semiconductor device, among other examples.

One or more of the semiconductor processing tools 102-114 and/or the wafer/die transport tool 116 may perform other semiconductor processing operations described herein, such as in connection with FIGS. 5A-5M and/or 10, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2A:
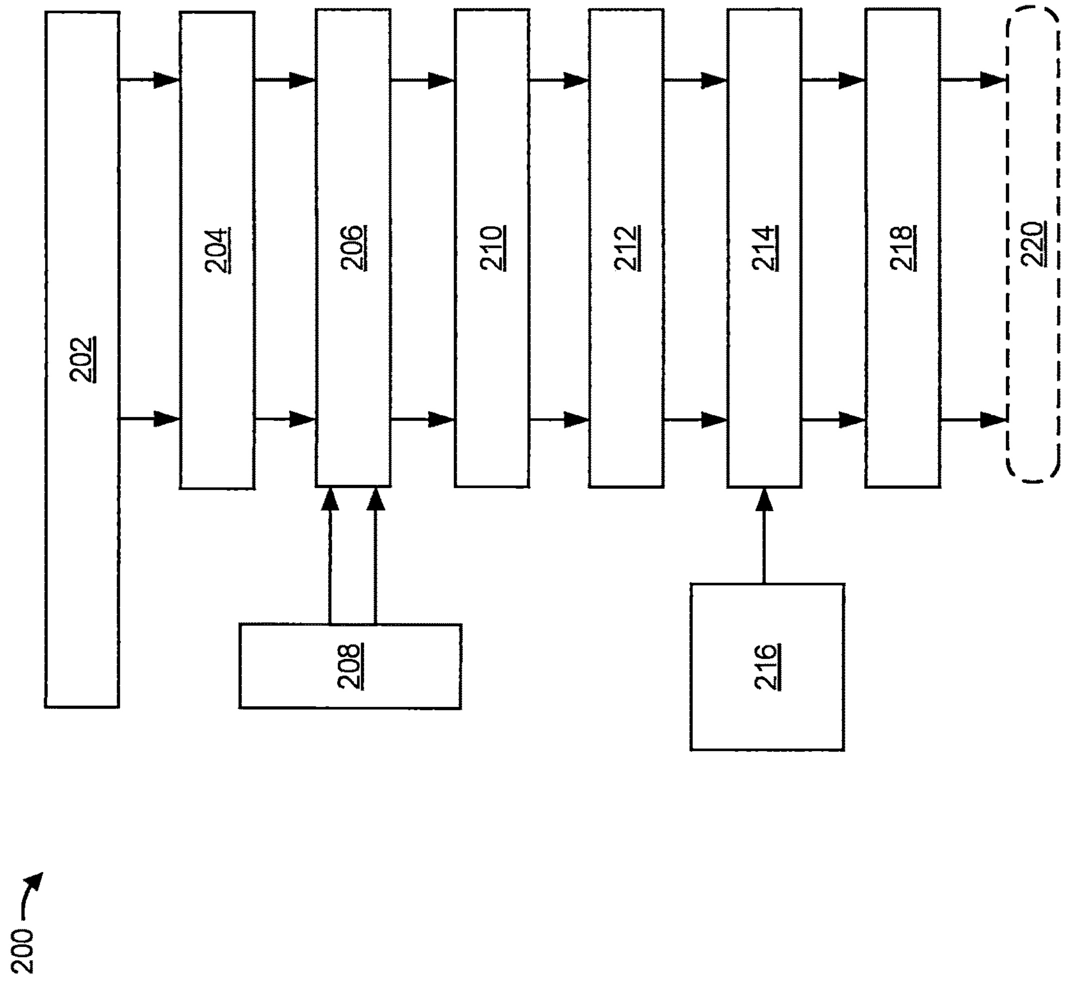
FIGS. 2A and 2B are diagrams of example implementations of driver circuits described herein.
Figure 2B:
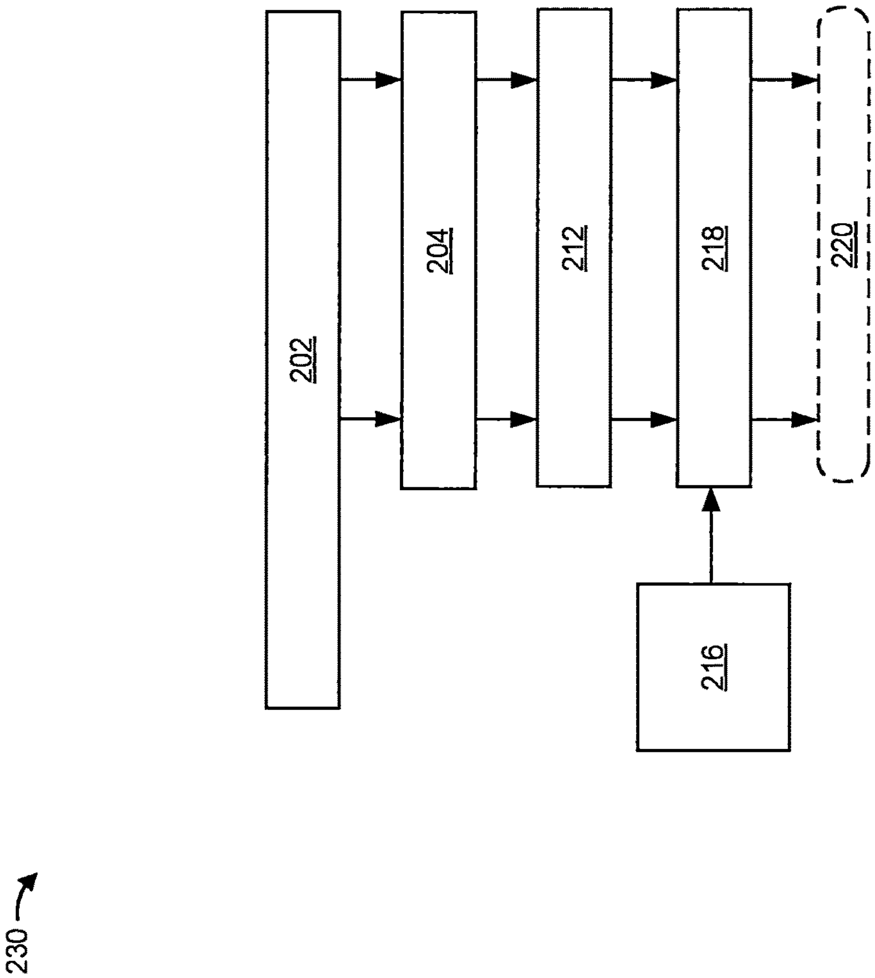

FIGS. 2A and 2B are diagrams of example implementations of driver circuits described herein. The driver circuits may be included in a driver integrated circuit (IC) device. The driver IC device may be configured for use with a display panel such as a liquid crystal display (LCD) panel and/or another type of display panel.

FIG. 2A illustrates an example implementation 200 of a source driver circuit. The source driver circuit may be included in the driver IC device and may be configured to operate as a data signal driver for supplying data signals (e.g., analog signals) to the display panel.

As shown in FIG. 2A, the source driver circuit may include a control circuit 202, a shift register circuit 204 coupled with the control circuit 202. The source driver circuit may include a sampling latch circuit 206 coupled with the shift register circuit 204. The source driver circuit may include a converter circuit 208 coupled with the sampling latch circuit 206. The source driver circuit may include a hold latch circuit 210 coupled with the sampling latch circuit 206. The source driver circuit may include a level shifter circuit 212 coupled with the hold latch circuit 210. The source driver circuit may include a digital to analog converter (DAC) circuit 214 coupled with the level shifter circuit 212. The source driver circuit may include a voltage reference circuit 216 coupled with the DAC circuit 214. The source driver circuit may include an output buffer circuit 218 coupled with the DAC circuit 214. Outputs 220 from the output buffer circuit 218 may be provided to the display panel and/or to another circuit in the driver IC device.

The control circuit 202 may include one or more electrical components and/or one or more circuits that are configured to control the timings for the source driver circuit. A graphic data signal is transmitted from the control circuit 202 to the source driver circuit, where the graphic data signal is converted from a digital signal to an analog signal (e.g., the outputs 220) and supplied to the display panel as a drive voltage.

The source driver circuit may include one or more low voltage circuits in which the graphic data signal is processed, such as the shift register circuit 204, the sampling latch circuit 206, and/or the hold latch circuit 210, among other examples. The source driver circuit may include one or more medium to high voltage circuits that are configured to convert the graphic data signal to the analog signal (e.g., the outputs 220), such as the level shifter circuit 212, the DAC circuit 214, and/or the output buffer circuit 218, among other examples.

The shift register circuit 204 and the converter circuit 208 may include one or more electrical components and/or one or more circuits that are configured to provide one or more rows of serialized graphic data signals to the sampling latch circuit 206. The converter circuit 208 may include a serial to parallel converter circuit that is configured to split the graphic data signal into separate and parallelized graphic data signals (e.g., a red graphic data signal, a blue graphic data signal, and a green graphic data signal, among other examples.

The hold latch circuit 210 may include one or more electrical components and/or one or more circuits that are configured to receive one or more graphic data signals from the sampling latch circuit 206 and to provide the one or more graphic data signals to the level shifter circuit 212.

The level shifter circuit 212 may include one or more electrical components and/or one or more circuits that are configured to increase the voltage of a graphic data signal from a low voltage (e.g., approximately 0 volts to approximately 1 volt) to a medium to high voltage (e.g., approximately 6 volts to approximately 8 volts or greater).

The DAC circuit 214 may include one or more electrical components and/or one or more circuits that are configured to convert a graphic data signal from a digital signal to an analog signal (e.g., the outputs 220) based on a reference voltage provided by the voltage reference circuit 216.

The output buffer circuit 218 may include one or more electrical components and/or one or more circuits that are configured to store or buffer the analog signal (e.g., the outputs 220) and to provide the analog signal to the display panel and/or to another circuit in the driver IC device.

FIG. 2B illustrates an example implementation 230 of a gate driver circuit. The gate driver circuit may be included in the driver IC device and may be configured to operate a scan signal driver for supplying scan signals in a pixel selection period for the display panel.

As shown in FIG. 2B, the gate driver circuit may include a control circuit 202, a shift register circuit 204, a level shifter circuit 212, a voltage reference circuit 216, and/or an output buffer circuit 218, among other examples. These circuits may perform similar operations as described above in connection with FIG. 2A to provide scan signals (e.g., outputs 220) in a pixel selection period for the display panel.

As indicated above, FIGS. 2A and 2B are provided as an example. Other examples may differ from what is described with regard to FIGS. 2A and 2B.

Figure 3A:
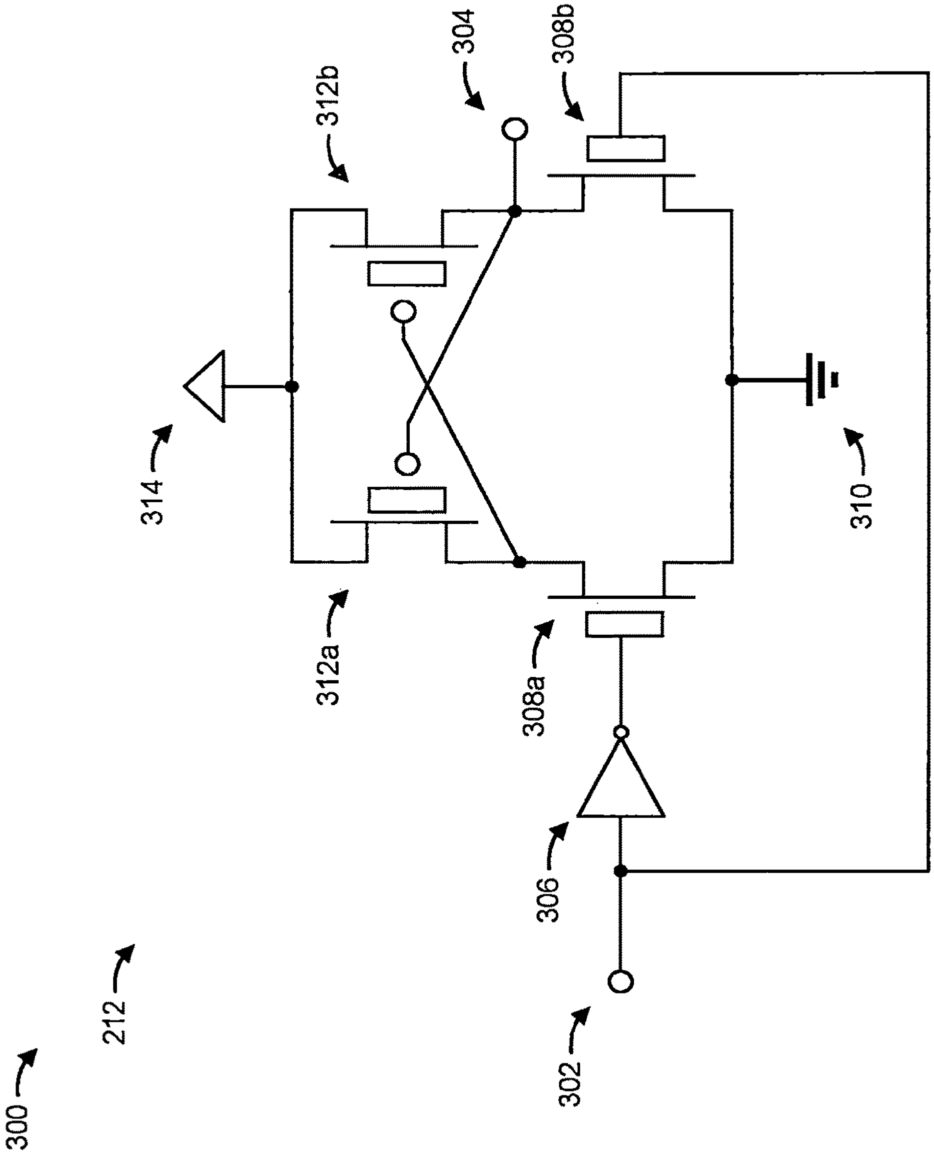
FIGS. 3A and 3B are diagrams of example implementations of level shifter circuits described herein.
Figure 3B:
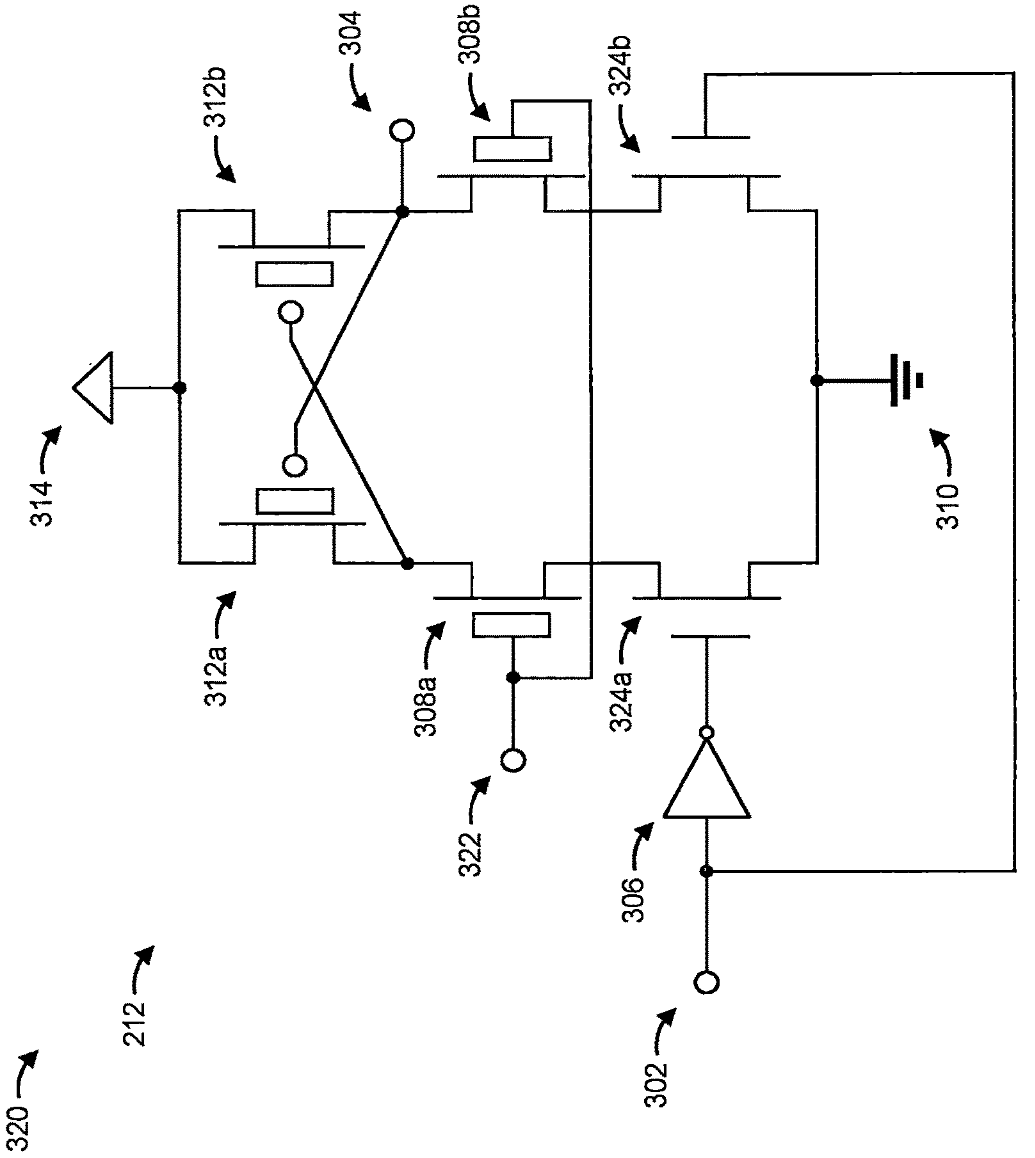

FIGS. 3A and 3B are diagrams of example implementations of level shifter circuits 212 described herein. One or more of the example implementations of level shifter circuits 212 illustrated and described in connection with FIG. 3A and/or FIG. 3B may be included in a driver circuit, such as the example implementation 200 of a gate driver circuit, the example implementation 230 of a source driver circuit, and/or another type of driver circuit.

FIG. 3A illustrates an example implementation 300 of a level shifter circuit 212. As shown in FIG. 3A, the level shifter circuit 212 may include a low voltage input 302 (e.g., approximately 0 volts to approximately 1 volts) and a medium to high voltage output 304 (e.g., approximately 6 volts to approximately 8 volts or greater). The low voltage input 302 may be coupled with an inverter 306. The inverter 306 may be coupled with a gate of an n-type transistor 308*a* such that an inverted version of the low voltage input 302 is provided to the gate of the n-type transistor 308*a*. A non-inverted version of the low voltage input 302 is provided to a gate of an n-type transistor 308*b*. Thus, the n-type transistor 308*a* and the n-type transistor 308*b* may operate based on a low gate voltage of approximately 0 volts to approximately 1 volt. However, other values for the range of the gate voltage for the n-type transistor 308*a* and the n-type transistor 308*b* are within the scope of the present disclosure.

The n-type transistors 308*a* and 308*b* may each be electrically coupled with an electrical ground 310. For example, a source/drain of each of the n-type transistors 308*a* and 308*b* may each be electrically coupled with an electrical ground 310. An output (e.g., a source/drain) of the n-type transistor 308*b* may be coupled with a gate of a p-type transistor 312*b*, and an output (e.g., a source/drain) of the n-type transistor 308*a* may be coupled with a gate of a p-type transistor 312*b*. The gates of the p-type transistors 312*a* and 312*b* may be inverted such that a signal provided to the gates of the p-type transistors 312*a* and 312*b* are inverted.

A first source/drain of the p-type transistor 312*a* may be coupled with a source/drain of the n-type transistor 308*a* and coupled with the gate of the p-type transistor 312*b*. A second source/drain of the p-type transistor 312*a* may be coupled with a medium to high voltage source 314 (e.g., approximately 6 volts to approximately 8 volts or greater). A first source/drain of the p-type transistor 312*b* may be coupled with a source/drain of the n-type transistor 308*b* and coupled with the gate of the p-type transistor 312*a*. A second source/drain of the p-type transistor 312*b* may be coupled with the medium to high voltage source 314.

In operation, the low voltage input 302 to the gates of the n-type transistors 308*a* and 308*b* may selectively control the outputs from the n-type transistors 308*a* and 308*b*. For example, the low voltage input 302 may selectively turn the n-type transistors 308*a* and 308*b* "on" (conductive channel formed between the source/drains of the n-type transistor 308*a* and/or of the n-type transistor 308*b*) or "off" (conductive channel not formed between the source/drains of the n-type transistor 308*a* and/or of the n-type transistor 308*b*). This selectively causes the output from the n-type transistor 308*a* to be low (e.g., tied to the electrical ground 310) or high (floating and tied to the medium to high voltage source 314), and similarly for the n-type transistor 308*b*. The outputs form the n-type transistors 308*a* and 308*b* selectively control the p-type transistors 312*a* and 312*b*, which selectively controls the medium to high voltage output 304 from the level shifter circuit 212.

FIG. 3B illustrates an example implementation 320 of a level shifter circuit 212. As shown in FIG. 3B, the example implementation 320 of the level shifter circuit 212 includes components 302-314 similar to the components 302-314 in the example implementation 300 of the level shifter circuit 212 in FIG. 3A.

As further shown in FIG. 3B, the example implementation 320 of the level shifter circuit 212 further includes a voltage buffer input 322 that is coupled with the gates of the n-type transistors 308*a* and 308*b*. Here, the voltage buffer input 322 may be used to selectively control (or buffer) the inputs to the gates of the p-type transistors 312*a* and 312*b*.

The example implementation 320 of the level shifter circuit 212 further includes low voltage n-type transistors 324*a* and 324*b* that are configured to receive the low voltage input 302. A first source/drain of the low voltage n-type transistor 324*a* may be coupled with the electrical ground 310. Similarly, a first source/drain of the low voltage n-type transistor 324*b* may be coupled with the electrical ground 310. A second source/drain of the low voltage n-type transistor 324*a* may be coupled with a source/drain of the n-type transistor 308*a*. Similarly, a second source/drain of the low voltage n-type transistor 324*b* may be coupled with a source/drain of the n-type transistor 308*b*.

As indicated above, FIGS. 3A and 3B are provided as an example. Other examples may differ from what is described with regard to FIGS. 3A and 3B.

Figure 4A:
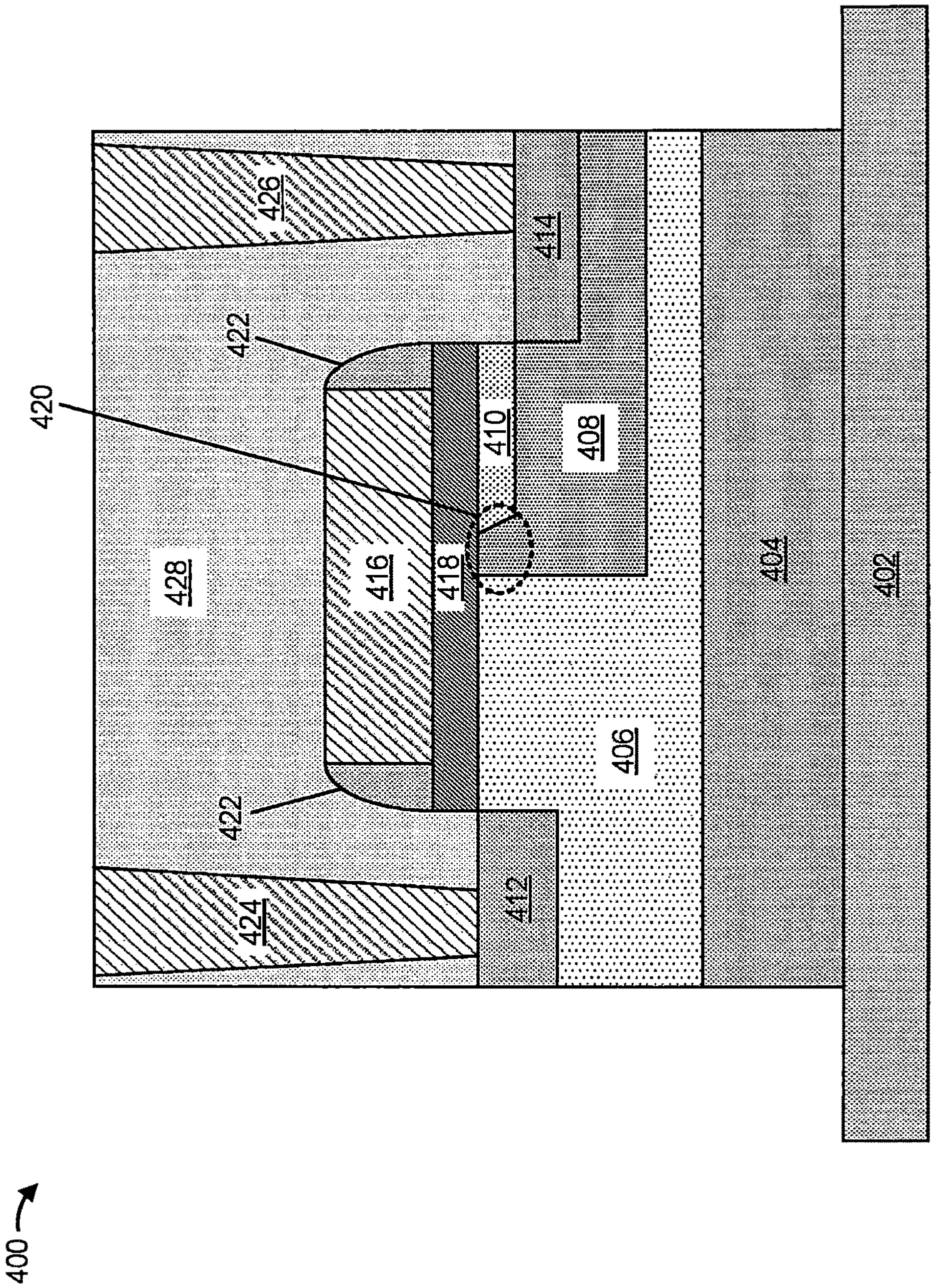
FIGS. 4A and 4B are diagrams of an example semiconductor device described herein.
Figure 4B:
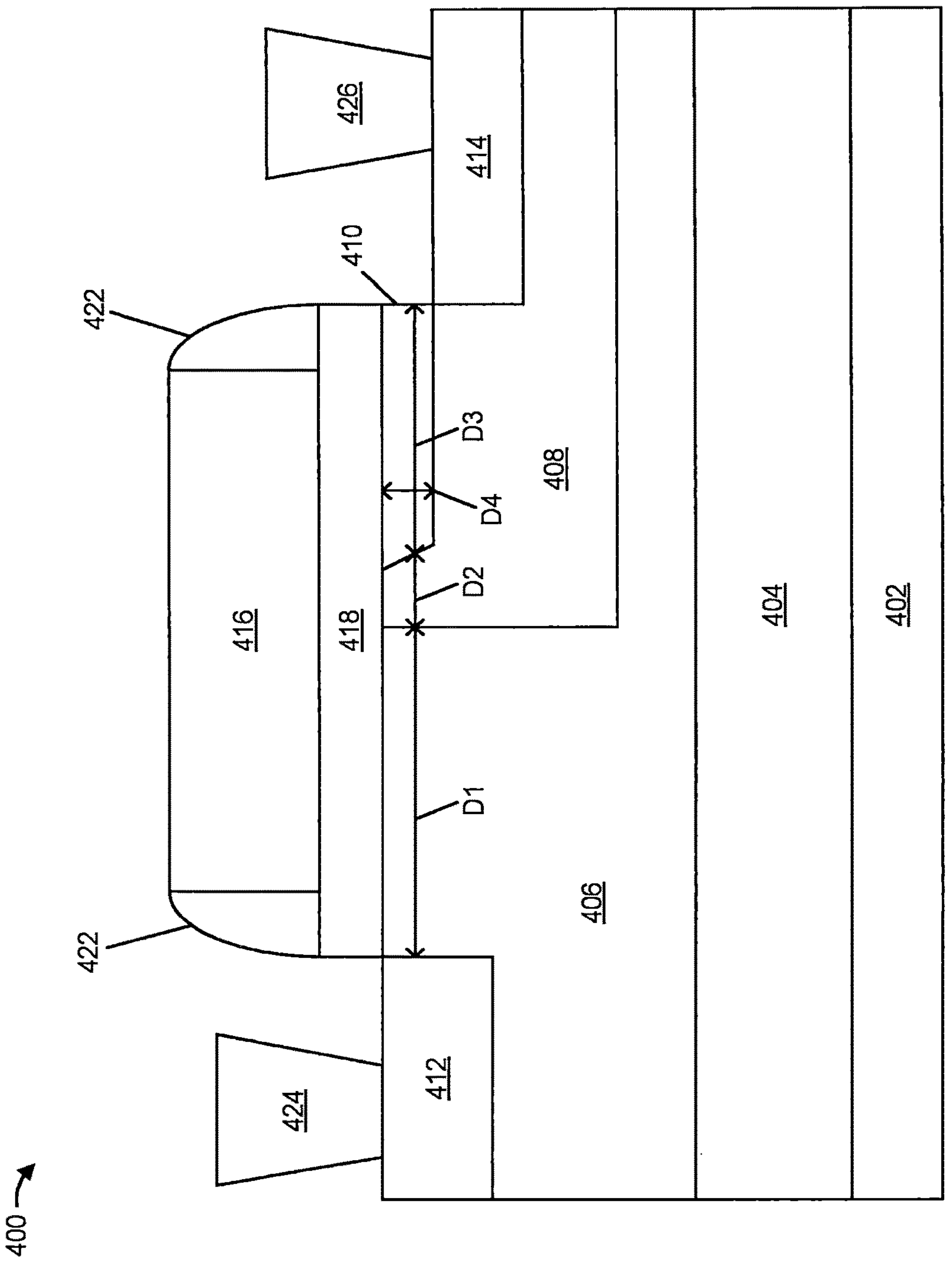

FIGS. 4A and 4B are diagrams of an example semiconductor device 400 described herein. The semiconductor device 400 may include a transistor structure. In particular, the semiconductor device 400 may include a medium-voltage transistor structure (e.g., a transistor structure that operates based on a gate voltage ($V_g$) that is included in a range of approximately 6 voltage to approximately 8 volts) a high-voltage transistor structure (e.g., a transistor structure that operates based on a gate voltage ($V_g$) that is greater than approximately 8 volts), and/or another type of transistor structure. One or more of the n-type transistors 308*a*, 308*b*, and/or one or more of the p-type transistors 312*a*. 312*b* may be implemented by the semiconductor device 400.

As shown in FIG. 4A, the semiconductor device 400 may include a substrate 402. The substrate 402 may include a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, a silicon carbide (SiC) substrate, or another type of semiconductor substrate. The substrate 402 may include various layers, including conductive or insulating layers formed on a semiconductor substrate. The substrate 402 may include a compound semiconductor and/or an alloy semiconductor. The substrate 402 may include various doping configurations to satisfy one or more design parameters.

As further shown in FIG. 4A, the semiconductor device 400 may include a deep well 404 over and/or on the substrate. The deep well 404 may include a deep n-well, a deep p-well, and/or another type of deep well. A deep n-well may refer to a region of the semiconductor device 400 that includes a semiconductor material (e.g., silicon (Si) and/or another semiconductor material) that is doped with one or more n-type dopants. Examples of n-type dopants include phosphorous (P), arsenic (As), and/or stibium (Sb), among other examples. A deep p-well may refer to a region of the semiconductor device 400 that includes a semiconductor material (e.g., silicon (Si) and/or another semiconductor material) that is doped with one or more p-type dopants. Examples of p-type dopants include boron (B), gallium (Ga), and/or indium (In), among other examples.

As further shown in FIG. 4A, the semiconductor device 400 may include a p-well region 406 over and/or on the deep well 404. The p-well region 406 may include a region of the semiconductor device 400 that includes a semiconductor material (e.g., silicon (Si) and/or another semiconductor material) that is doped with one or more p-type dopants (e.g., boron (B), gallium (Ga), and/or indium (In), among other examples).

As further shown in FIG. 4A, the semiconductor device 400 may include an n-type lightly-doped source/drain (NLDD) region 408 in the p-well region 406. The NLDD region 408 may include a region of the semiconductor device 400 that includes a semiconductor material (e.g., silicon (Si) and/or another semiconductor material) that is lightly doped with one or more n-type dopants (e.g., phosphorous (P), arsenic (As), and/or stibium (Sb), among other examples). For example, the NLDD region 408 may be "lightly doped" in that the NLDD region 408 may include a concentration of dopants that is included in a range of approximately $1E^{11}$ n-type ions per $cm^2$ to approximately $5E^{13}$ n-type ions per $cm^2$. The light doping in the NLDD region 408 enables a threshold voltage ($V_t$) of the semiconductor device 400 to be reduced while enabling medium to high voltage operation at one or more source/drain region of the semiconductor device 400.

To reduce the amount and/or likelihood of current leakage in the semiconductor device 400 due to the light doping in the NLDD region 408, a buffer layer 410 may be included over and/or on a portion of the NLDD region 408. The buffer layer 410 may reduce the amount and/or likelihood of current leakage in the semiconductor device 400 by suppressing subthreshold leakage in the semiconductor device 400, which is current leakage that occurs when the semiconductor device 400 is operating at a gate voltage ($V_G$) that is less than the threshold voltage ($V_t$ or $V_{th}$) of the semiconductor device 400. The buffer layer 410 may include an oxide material such as a silicon oxide ($SiO_x$ such as $SiO_2$) and/or another oxide material, an oxide-nitride material such as silicon oxynitride (SiON), a nitride material such as a silicon nitride ($Si_xN_y$ such as $Si_3N_4$), and/or another type of dielectric material.

The semiconductor device 400 may include a source/drain region 412 and a source/drain region 414. The source/drain regions 412 and 414 may each include silicon (Si) with one or more dopants, such as a p-type material (e.g., boron (B) or germanium (Ge), among other examples), an n-type material (e.g., phosphorous (P) or arsenic (As), among other examples), and/or another type of dopant. The source/drain region 412 may be included in the p-well region 406. The source/drain region 414 may be included in the NLDD region 408 and adjacent to the buffer layer 410.

In some implementations, the source/drain region 412 corresponds to a source region of the semiconductor device 400 and the source/drain region 414 corresponds to a drain region of the semiconductor device 400. In these implementations, the source/drain region 414 may be configured to operate at medium to high voltages, such as up to approximately 6 volts, approximately 8 volts, and/or greater. Thus, the source/drain region 414 is configured to operate at a greater operational voltage relative to the operational voltage of a gate structure of the semiconductor device 400. In some implementations, the source/drain region 412 corresponds to a drain region of the semiconductor device 400 and the source/drain region 414 corresponds to a source region of the semiconductor device 400. In some implementations, the source/drain region 412 corresponds to a source region of the semiconductor device 400 and a source region or a drain region of another semiconductor device. In some implementations, the source/drain region 414 corresponds to a drain region of the semiconductor device 400 and a source region or a drain region of another semiconductor device.

The concentration of dopants in the source/drain regions 412 and 414 may be greater relative to the concentration of dopants in the NLDD region 408. For example, the NLDD region 408 may be "lightly-doped" in that the NLDD region 408 may include a concentration of dopants that is included in a range of approximately $1E^{11}$ n-type ions per $cm^2$ to approximately $5E^{13}$ n-type ions per $cm^2$, whereas the source/drain regions 412 and 414 may each include a concentration of dopants that is included in a range of approximately $1E^{14}$ n-type ions per $cm^2$ to approximately $1E^{16}$ n-type ions per $cm^2$.

The NLDD region 408 may include a concentration of dopants that is included in a range of approximately $1E^{11}$ n-type ions per $cm^2$ to approximately $5E^{13}$ n-type ions per $cm^2$ to achieve a sufficiently high on-mode current for the semiconductor device 400, and/or to achieve a sufficiently low off-mode current leakage for the semiconductor device 400. However, other values for the range are within the scope of the present disclosure.

The source/drain regions 412 and 414 may each include a concentration of dopants that is included in a range of approximately $1E^{14}$ n-type ions per $cm^2$ to approximately $1E^{16}$ n-type ions per $cm^2$ to achieve a sufficiently high on-mode current for the semiconductor device 400, and/or to achieve a sufficiently low off-mode current leakage for the semiconductor device 400. However, other values for these ranges are within the scope of the present disclosure.

In some implementations, the concentration of dopants in the p-well region 406 may be included in a range of approximately $1E^{11}$ p-type ions per $cm^2$ to approximately $5E^{13}$ p-type ions per $cm^2$. However, other values for the range are within the scope of the present disclosure.

The semiconductor device 400 may include a gate structure 416 between the source/drain regions 412 and 414. The gate structure 416 may be formed of one or more layers and/or one or more materials. The gate structure 416 may include one or more metal materials, one or more high dielectric constant (high-k) materials, and/or one or more other types of materials. For example, the gate structure 416 may include a work function tuning layer, an interfacial layer, and/or a metal electrode layer, among other examples.

The semiconductor device 400 may include a gate oxide layer 418. The gate oxide layer 418 may include an oxide material (e.g., an HTO and/or another type of gate oxide) and/or another type of dielectric material. The gate oxide layer 418 may have a sufficient thickness to support the medium to high voltages (e.g., 6 volts, 8 volts, and/or greater voltages) handled by the semiconductor device 400. For example, the thickness of the gate oxide layer 418 may be included in a range of approximately 150 angstroms to approximately 300 angstroms to support the medium to high voltages handled by the semiconductor device 400. However, other values for the range are within the scope of the present disclosure.

The semiconductor device 400 may include a gate oxide layer 418 under the gate structure 416. The gate oxide layer 418 may be located between the source/drain regions 412 and 414. Moreover, the gate oxide layer 418 may be located over and/or on (and may be in contact with) a portion of the p-well region 406 that is between the source/drain region 412 and the NLDD region 408. Moreover, the gate oxide layer 418 may be located over and/or on (and may be in contact with) the buffer layer 410. Moreover, the gate oxide layer 418 may be located over and/or on (and may be in contact with) an extension region 420 of the NLDD region 408. The extension region 420 may include a portion of the NLDD region 408 that extends along a sidewall of the buffer layer 410 and an opposing sidewall of the p-well region 406, and contacts the gate oxide layer 418.

One or more spacer layers 422 may be included over and/or on sidewalls of the gate structure 416. The one or more spacer layers 422 may include one or more low dielectric constant (low-k) materials having a dielectric constant that is less than the dielectric constant of silicon oxide (e.g., less than approximately 3.9), a silicon oxide ($SiO_x$), a silicon oxynitride (SiON), a silicon nitride ($Si_xN_y$), silicon oxycarbonitride (SiOCN), and/or another suitable dielectric material.

A contact structure 424 (e.g., a source/drain contact or MD) may be included over and/or on the source/drain region 412. A contact structure 426 (e.g., a source/drain contact or MD) may be included over and/or on the source/drain region 414. The contact structures 424 and 426 may each include a via, an interconnect, a trench, a contact plug, and/or another type of electrically conductive structure. The contact structures 424 and 426 may each include tungsten (W), cobalt (Co), ruthenium (Ru), titanium (Ti), aluminum (Al), copper (Cu) or gold (Au), among other examples of electrically conductive materials.

The contact structures 424 and 426 may be included in an interlayer dielectric (ILD) layer 428. The ILD layer 428 may be included over the source/drain regions 412 and 414, over and/or of the gate structure 416 of the semiconductor device 400. The ILD layer 428 may be included to provide electrical isolation and/or insulation between the gate structure 416 and/or the source/drain regions 412 and 414 of the semiconductor device 400, among other examples. The ILD layer 428 may include a silicon nitride ($SiN_x$), an oxide (e.g., a silicon oxide ($SiO_x$) and/or another oxide material), and/or another type of dielectric material.

The dopant types of the various regions and/or layers illustrated and described in connection with FIG. 4A are examples, and the semiconductor device 400 may include another configuration of dopant types for the various regions and/or layers. For example, the p-well region 406 may alternatively include an n-well region, the NLDD region 408 may alternatively include a p-well lightly-doped source/drain region, and/or the source/drain regions 412 and 414 may include p-type doped source/drain regions.

In general, the semiconductor device 400 may include a first doped region (e.g., the p-well region 406) that includes a first dopant type. The semiconductor device 400 may include a second doped region (e.g., the NLDD region 408), in the first doped region, that is lightly-doped and that includes a second dopant type. The semiconductor device 400 may include a third doped region (e.g., the source/drain region 412), in the first doped region, that includes the second dopant type, where the third doped region corresponds to a first source/drain region of the semiconductor device 400. The semiconductor device 400 may include a fourth doped region (e.g., the source/drain region 414), in the second doped region, that includes the second dopant type, where the fourth doped region corresponds to a second source/drain region of the semiconductor device 400. The semiconductor device 400 may include the buffer layer 410 over a portion of second doped region. The semiconductor device 400 may include the gate oxide layer 418 over a portion of the first doped region, over the buffer layer 410, and over the extension region 420 of the second doped region. The semiconductor device 400 may include the gate structure 416 over the gate oxide layer 418.

FIG. 4B illustrates one or more example dimensions of the semiconductor device 400. As shown in FIG. 4B, the semiconductor device 400 may include an example dimension D1, an example dimension D2, an example dimension D3, and/or an example dimension D4, among other example dimensions.

The example dimension D1 may correspond to a length of the p-well region 406 between the source/drain region 412 and the NLDD region 408. In some implementations, length of the p-well region 406 may be the length of a portion of the p-well region 406 that is under the gate oxide layer 418. In some implementations, the dimension D1 may be included in a range of approximately 0.2 microns to approximately 2 microns to achieve a sufficiently high on-mode current for the semiconductor device 400, and/or to achieve a sufficiently low off-mode current leakage for the semiconductor device 400. However, other values for the range are within the scope of the present disclosure.

The example dimension D2 may correspond to a length of the extension region 420 of the NLDD region 408 between the p-well region 406 and the buffer layer 410. In some implementations, the dimension D2 may be included in a range of approximately 0.05 microns to approximately 1 micron to achieve a sufficiently high on-mode current for the semiconductor device 400, and/or to achieve a sufficiently low off-mode current leakage for the semiconductor device 400. However, other values for the range are within the scope of the present disclosure.

The example dimension D3 may correspond to a length of the buffer layer 410 between the source/drain region 414 and the NLDD region 408. In some implementations, the dimension D3 may be included in a range of approximately 0.1 microns to approximately 5 microns to achieve a sufficiently high on-mode current for the semiconductor device 400, and/or to achieve a sufficiently low off-mode current leakage for the semiconductor device 400. However, other values for the range are within the scope of the present disclosure.

The example dimension D4 may correspond to a thickness of the buffer layer 410. In some implementations, the dimension D4 may be included in a range of approximately 10 nanometers to approximately 100 nanometers to achieve a sufficiently high gate-to-drain breakdown voltage for the semiconductor device 400, and/or to achieve a sufficiently low off-mode current leakage for the semiconductor device 400. However, other values for the range are within the scope of the present disclosure.

As indicated above, FIGS. 4A and 4B are provided as an example. Other examples may differ from what is described with regard to FIGS. 4A and 4B.

FIGS. 5A-5M are diagrams of an example implementation 500 described herein. The example implementation 500 includes an example of forming the semiconductor device 400 described herein. In some implementations, one or more of the semiconductor processing operations described in connection with the example implementation 500 may be performed by one or more of the semiconductor processing tools 102-114 and/or by the wafer/die transport tool 116. In some implementations, one or more of the semiconductor processing operations described in connection with the example implementation 500 may be performed by another semiconductor processing tool.

Figure 5A:
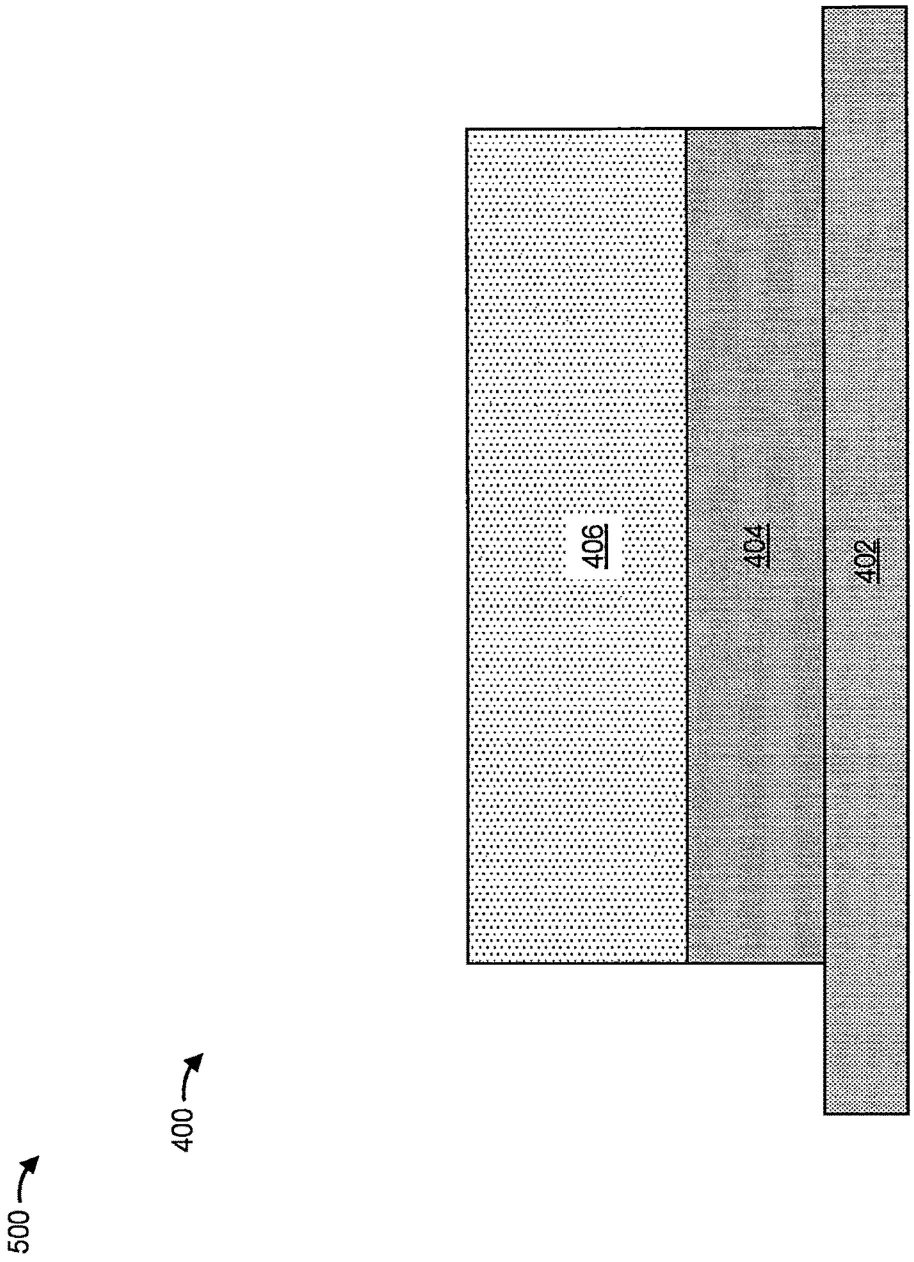
FIGS. 5A-5M are diagrams of an example implementation described herein.

Turning to FIG. 5A, the substrate 402 may be provided. The substrate 402 may be provided as a semiconductor wafer, a semiconductor die, and/or another type of semiconductor substrate. In some implementations, the substrate 402 may be a doped substrate, such as a semiconductor substrate that is doped with one or more p-type dopants, a semiconductor substrate that is doped with one or more n-type dopants, and/or another type of doped substrate. In some implementations, the substrate 402 has a bulk resistivity (or volumetric resistivity) that is included in a range of approximately 1 ohm-centimeter to approximately 100 ohm-centimeters. However, other values for the range are within the scope of the present disclosure.

As further shown in FIG. 5A, one or more layers and/or regions may be formed in, over, and/or on the substrate 402. For example, the deep well 404 may be formed in and/or on the substrate 402. As another example, the p-well region 406 may be formed in the substrate 402 and/or on the deep well 404.

In some implementations, the ion implantation tool 114 forms the deep well 404 by performing an ion implantation operation to implant ions (e.g., p-type ions, n-type ions) into the substrate 402 to form the deep well 404. The ion implantation tool 114 may direct an ion beam toward the substrate 402 such that the ions are implanted below the surface of the substrate 402 to dope the substrate 402. Additionally and/or alternatively, the deposition tool 102 may deposit the deep well 404 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the deep well 404 after the deposition tool 102 deposits the deep well 404.

In some implementations, the ion implantation tool 114 forms the p-well region 406 by performing an ion implantation operation to implant ions (e.g., p-type ions, n-type ions) into the substrate 402 to form the p-well region 406. The ion implantation tool 114 may direct an ion beam toward the substrate 402 such that the ions are implanted below the surface of the substrate 402 to dope the substrate 402. Additionally and/or alternatively, the deposition tool 102 may deposit the p-well region 406 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the p-well region 406 after the deposition tool 102 deposits the p-well region 406. In some implementations, the p-well region 406 may be formed such that the concentration of dopants in the p-well region 406 may be included in a range of approximately $1E^{11}$ p-type ions per $cm^2$ to approximately $5E^{13}$ p-type ions per $cm^2$. However, other values for the range are within the scope of the present disclosure.

Figure 5B:
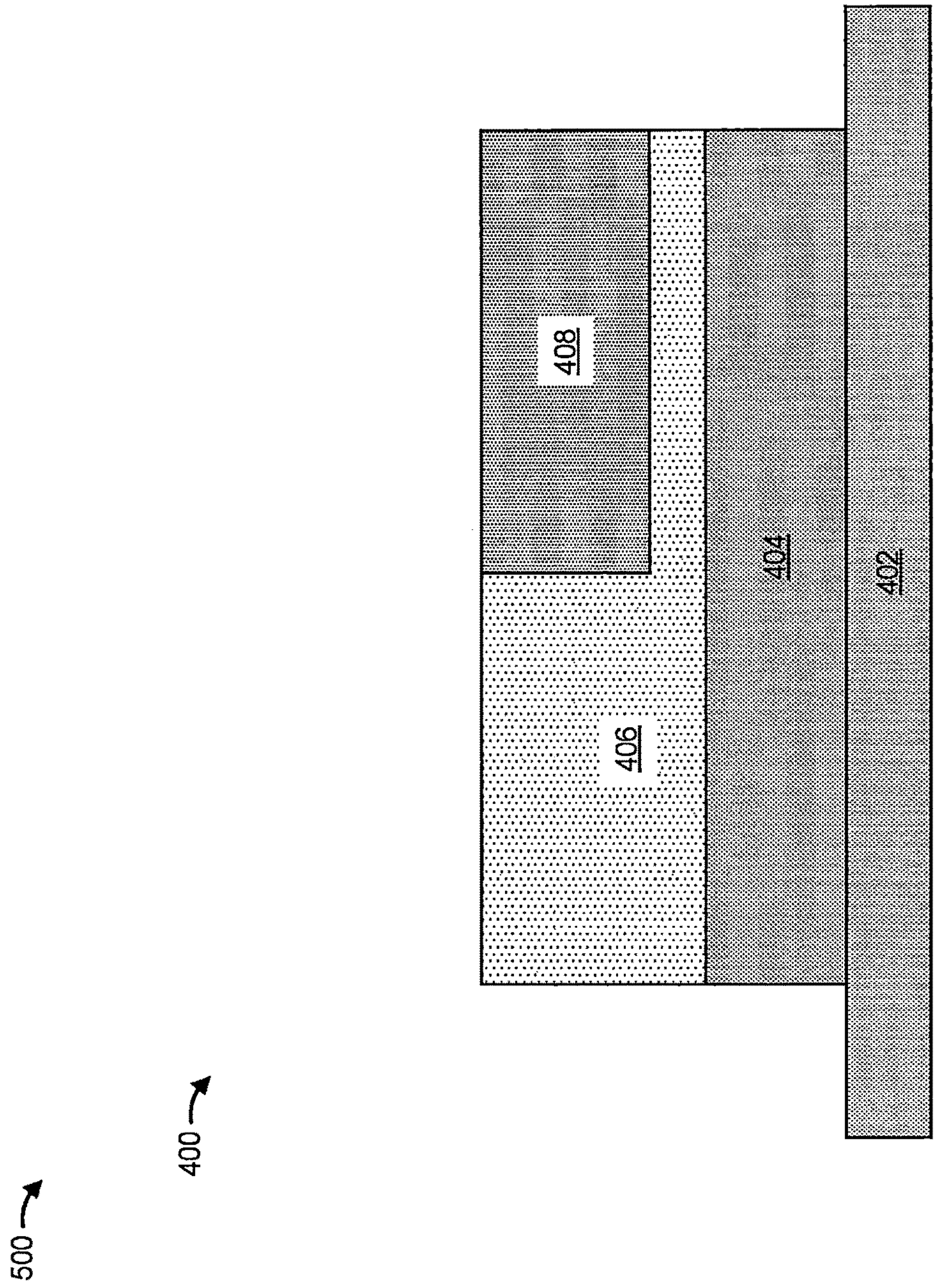

As shown in FIG. 5B, the NLDD region 408 may be formed in a portion of the p-well region 406. In some implementations, an implantation mask is used to mask off another portion of the p-well region 406 so that the NLDD region 408 is formed only in the portion of the p-well region 406. In some implementations, the ion implantation tool 114 forms the NLDD region 408 by performing an ion implantation operation to implant ions (e.g., p-type ions, n-type ions) into the substrate 402 to form the NLDD region 408 in the p-well region 406. The ion implantation tool 114 may direct an ion beam toward the p-well region 406 such that the ions are implanted in the p-well region 406 to form the NLDD region 408. The NLDD region 408 may be formed to include a concentration of dopants that is included in a range of approximately $1E^{11}$ n-type ions per $cm^2$ to approximately $5E^{13}$ n-type ions per $cm^2$ to achieve a sufficiently high on-mode current for the semiconductor device 400, and/or to achieve a sufficiently low off-mode current leakage for the semiconductor device 400. However, other values for the range are within the scope of the present disclosure.

Figure 5C:
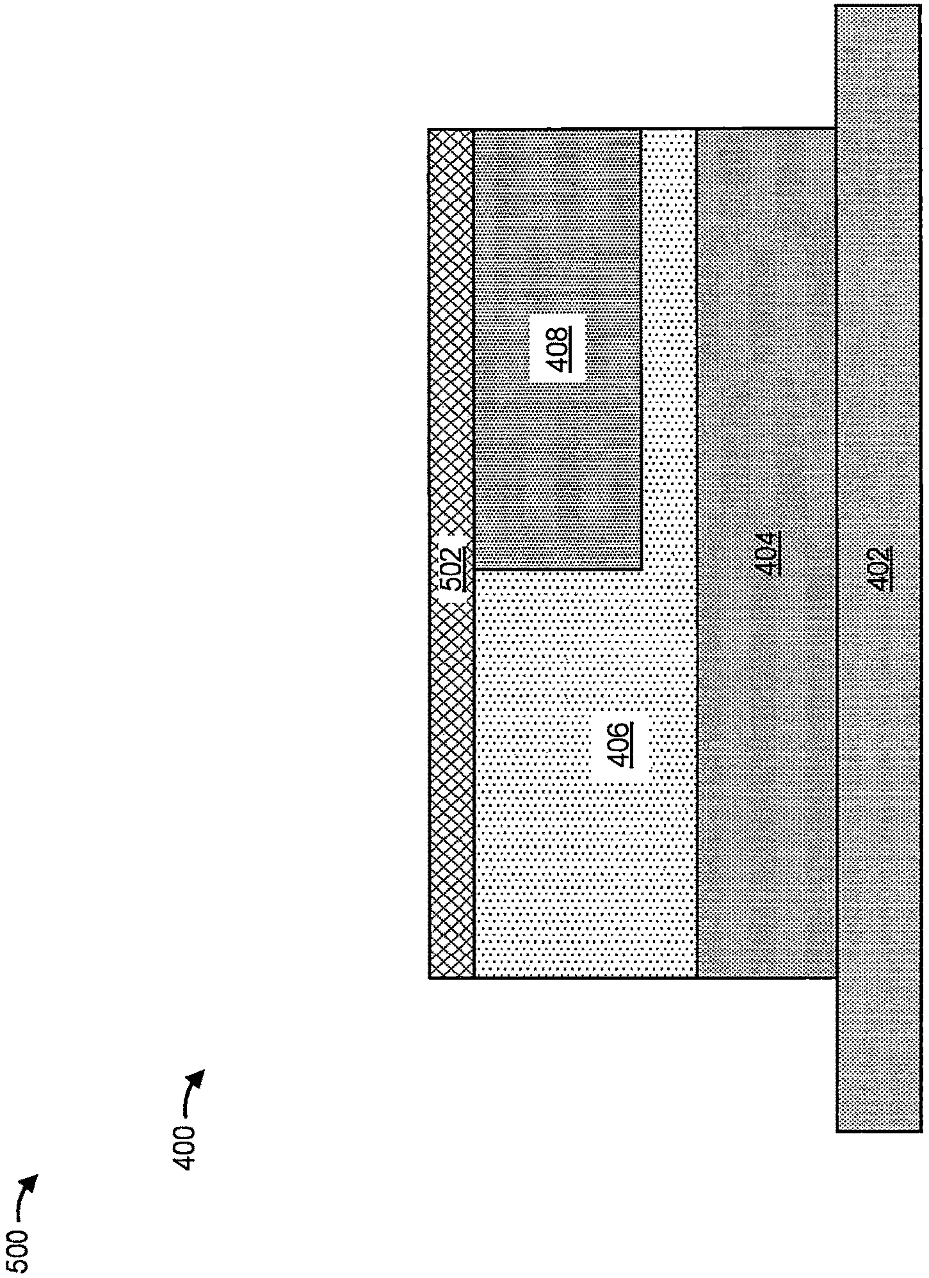

As shown in FIG. 5C, a masking layer 502 may be formed over and/or on the top surface of the p-well 406 and/or over and/or on the top surface of the NLDD region 408. In some implementations, the masking layer 502 includes a hard mask formed of a dielectric material, such as an oxide material such as a silicon oxide ($SiO_x$ such as $SiO_2$) and/or another oxide material, an oxide-nitride material such as silicon oxynitride (SiON), a nitride material such as a silicon nitride ($Si_xN_y$ such as $Si_3N_4$), and/or another type of dielectric material. In some implementations, the masking layer 502 includes a photoresist layer. The deposition tool 102 may deposit the masking layer 502 in a PVD operation, an ALD operation, a CVD operation, a spin-coating operation, an epitaxy operation, an oxidation operation, another type of deposition operation described in connection with FIG. 1, and/or another suitable deposition operation. In some implementations, the planarization tool 110 planarizes the masking layer 502 after the deposition tool 102 deposits the masking layer 502.

Figure 5D:
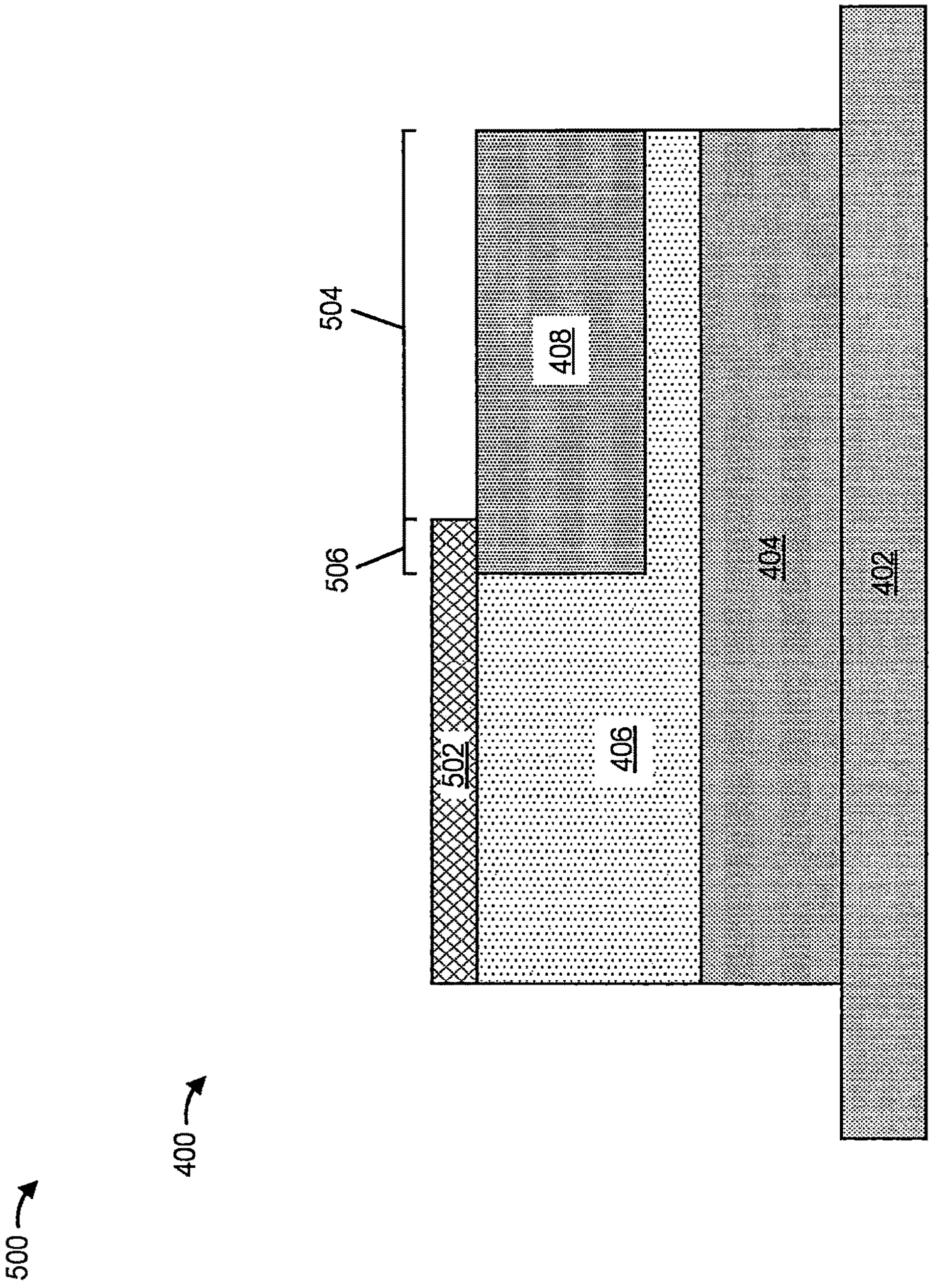

As shown in FIG. 5D, a first portion of the masking layer 502 may be removed. A second portion of the masking layer 502 remains on the semiconductor device 400 and corresponds to a pattern in the masking layer 502. A portion 504 of the NLDD region 408 is exposed through the pattern in the masking layer 502. The second portion of the masking layer 502 may remain on the top surface of the p-well region 406 and on the top surface of a portion 506 of the NLDD region 408. The width of the portion 506 may correspond to the width (e.g., dimension D2) of the extension region 420 of the NLDD region 408.

In some implementations, a pattern in a photoresist layer is used to etch the masking layer 502 to form the pattern in the masking layer 502. In these implementations, the deposition tool 102 forms the photoresist layer on the masking layer 502. The exposure tool 104 exposes the photoresist layer to a radiation source to pattern the photoresist layer. The developer tool 106 develops and removes portions of the photoresist layer to expose the pattern. The etch tool 108 etches the masking layer 502 based on the pattern to form the pattern in the masking layer 502. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a photoresist removal tool removes the remaining portions of the photoresist layer (e.g., using a chemical stripper, plasma ashing, and/or another technique).

Figure 5E:
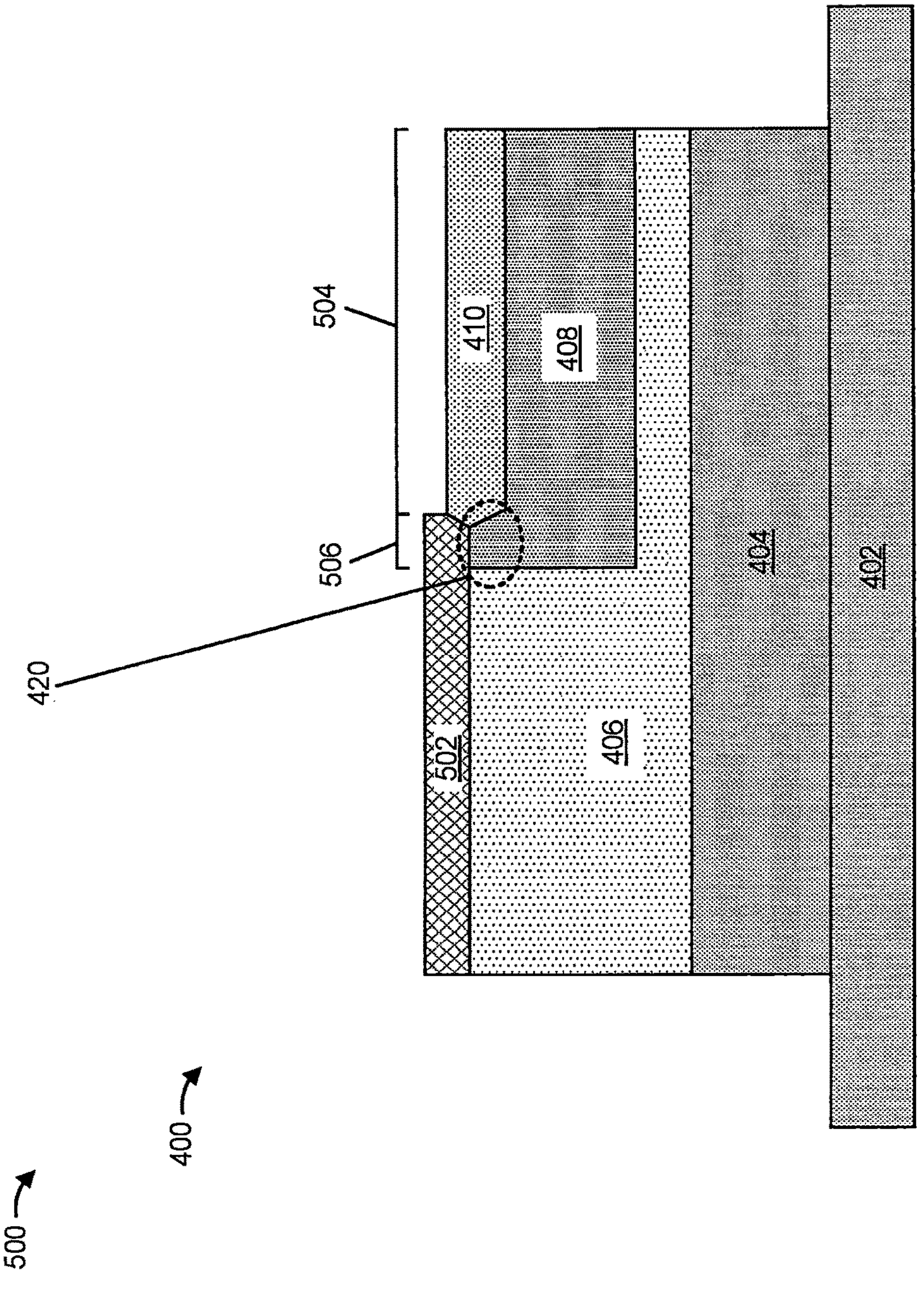

As shown in FIG. 5E, the buffer layer 410 may be formed over and/or on the NLDD region 408. The buffer layer 410 may be formed over and/or on the portion 504 of the NLDD region 408 that is exposed through the pattern in the buffer layer 410. The deposition tool 102 may deposit the buffer layer 410 in a PVD operation, an ALD operation, a CVD operation, a spin-coating operation, an epitaxy operation, an oxidation operation, another type of deposition operation described in connection with FIG. 1, and/or another suitable deposition operation. In some implementations, the deposition tool 102 forms the buffer layer 410 using a thermal oxidation technique, in which the deposition tool 102 provides an oxygen-containing reactant to the top surface of the NLDD region 408. The oxygen-containing reactant may react with the silicon in the NLDD region 408 at a high temperature, which oxidizes the silicon to grow silicon oxide ($SiO_x$ such as $SiO_2$) on the NLDD region 408.

In some implementations, prior to formation of the buffer layer 410, the etch tool 108 may etch the NLDD region 408 based on the pattern in the masking layer 502 to remove material from the NLDD region 408. The buffer layer 410 may then be formed on the NLDD region 408 after the NLDD region 408 is etched. Alternatively, the buffer layer 410 may be formed in and/or on (e.g., by thermal oxidation) the NLDD region 408 without etching the NLDD region 408.

Figure 5F:
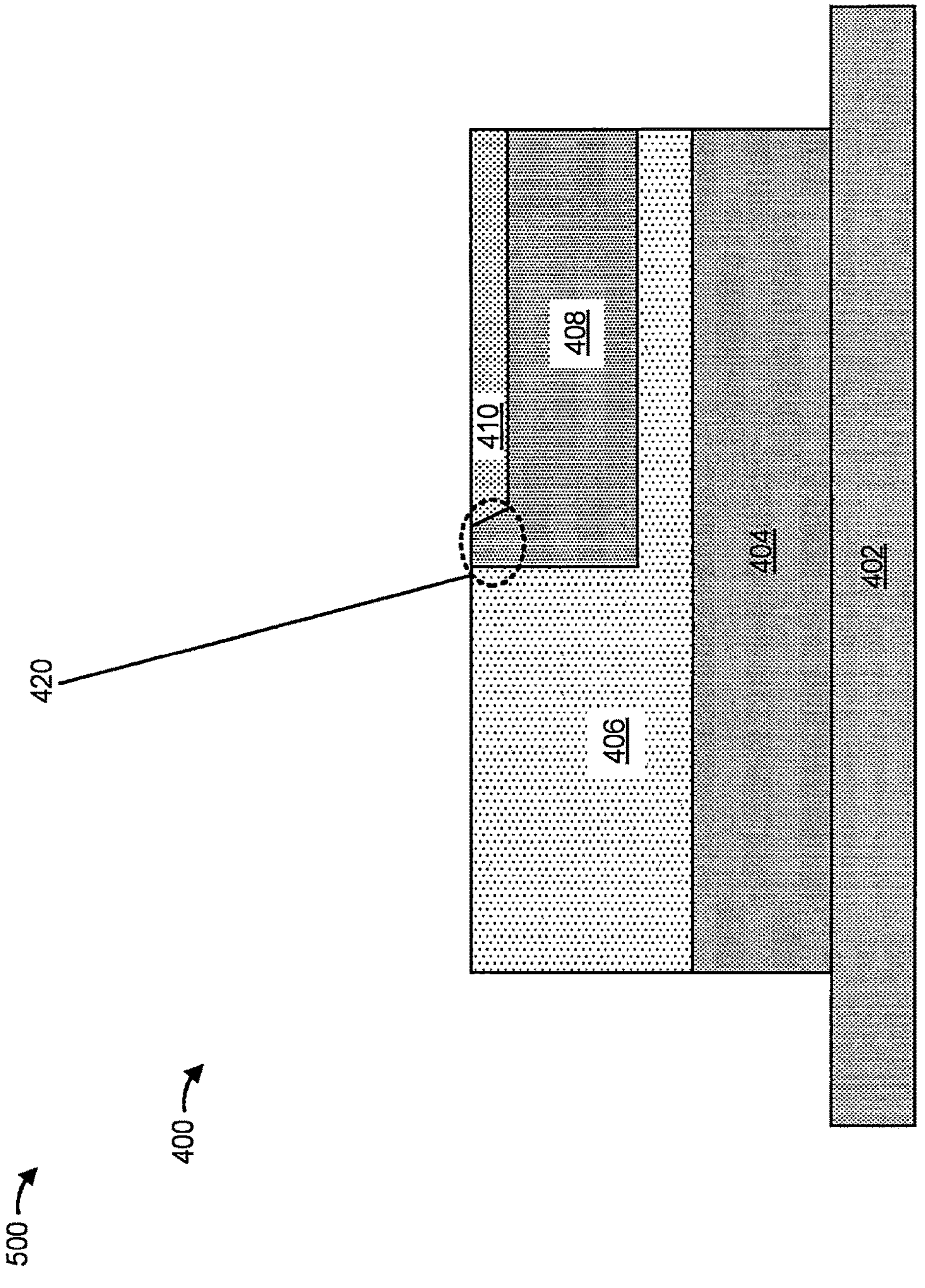

As shown in FIG. 5F, the masking layer 502 may be removed from the semiconductor device 400 after formation of the buffer layer 410. In some implementations, the planarization tool 110 planarizes the masking layer 502 to remove the masking layer 502. Here, the planarization tool 110 may planarize the masking layer 502 and may planarize the buffer layer 410 to remove excess material from the buffer layer 410 until the top surface of the p-well region 406, the top surface of the extension region 420 of the NLDD region 408, and the top surface of the buffer layer 410 are approximately co-planar.

Additionally and/or alternatively, the etch tool 108 may remove the masking layer 502 by etching the masking layer 502 in an etch operation. In some implementations, the etch operation includes a plasma etch operation, a wet chemical etch operation, and/or another type of etch operation.

Figure 5G:
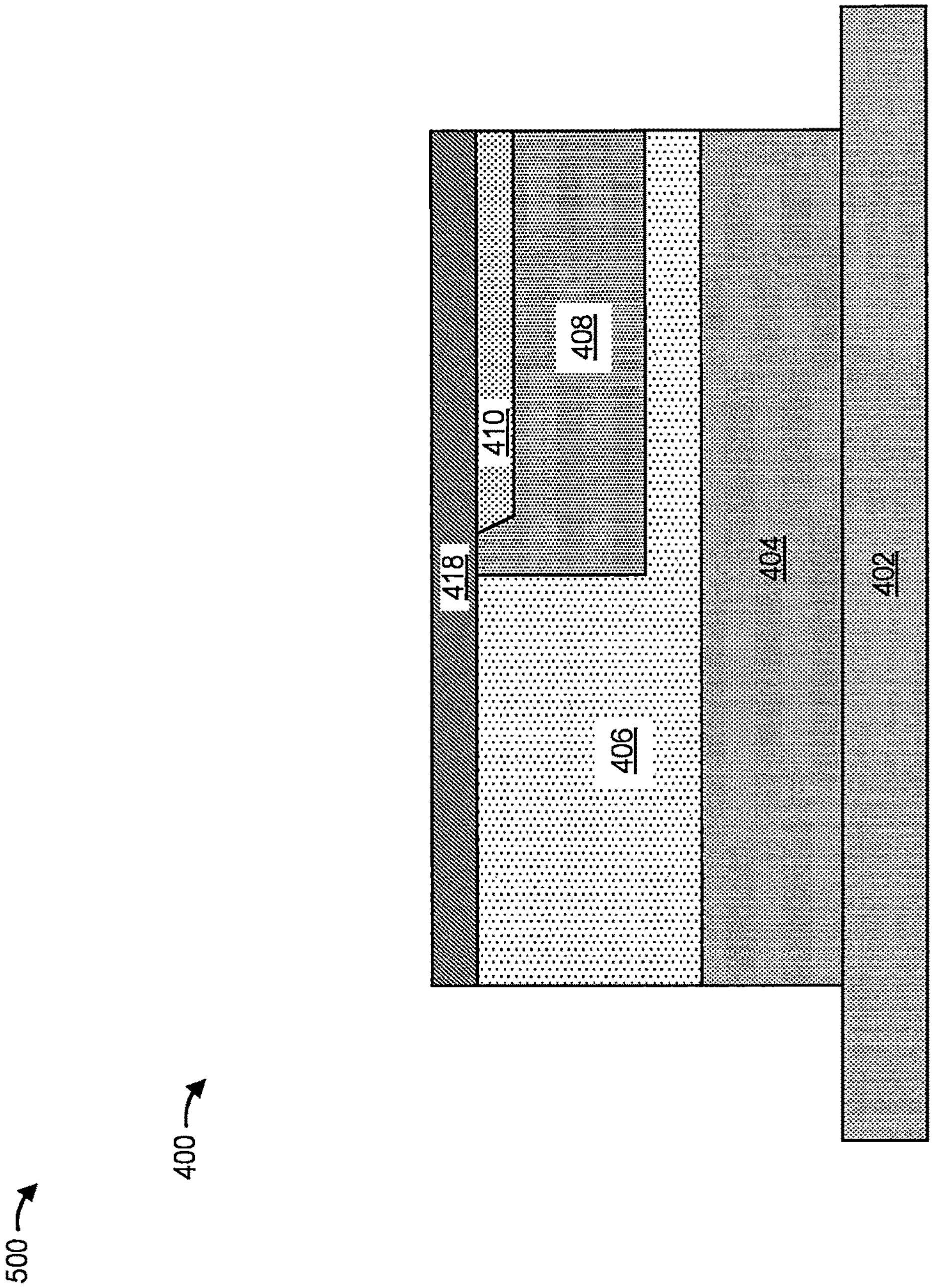

As shown in FIG. 5G, the gate oxide layer 418 may be formed over and/or on the top surface of the p-well region 406, over and/or on the top surface of the extension region 420 of the NLDD region 408, and/or over and/or on the top surface of the buffer layer 410. The deposition tool 102 may deposit the gate oxide layer 418 in a PVD operation, an ALD operation, a CVD operation, a spin-coating operation, an epitaxy operation, an oxidation operation (e.g., a high-temperature thermal oxidation operation), another type of deposition operation described in connection with FIG. 1, and/or another suitable deposition operation. In some implementations, the planarization tool 110 planarizes the gate oxide layer 418 after the deposition tool 102 deposits the gate oxide layer 418.

Figure 5H:
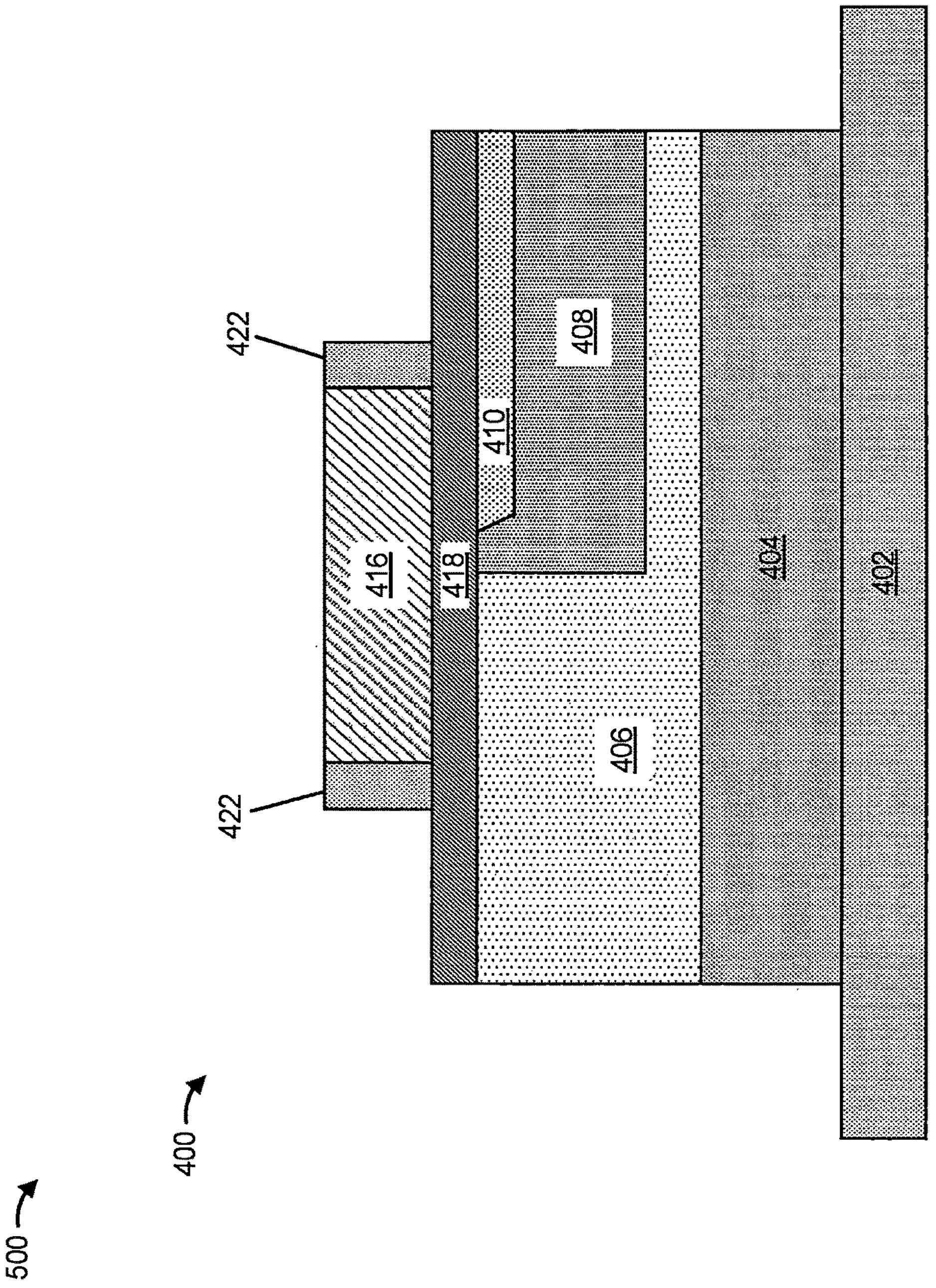

As shown in FIG. 5H, the gate structure 416 and the spacer layers 422 may be formed over and/or on the gate oxide layer 418. The deposition tool 102 and/or the plating tool 112 may deposit the gate structure 416 in a CVD operation, a PVD operation, an ALD operation, an electroplating operation, another deposition operation described above in connection with FIG. 1, and/or another suitable deposition operation. In some implementations, a seed layer is first deposited, and the gate structure 416 is deposited on the seed layer.

The deposition tool 102 may deposit the spacer layers 422 in a PVD operation, an ALD operation, a CVD operation, an epitaxy operation, an oxidation operation, another type of deposition operation described in connection with FIG. 1, and/or another suitable deposition operation. In some implementations, the deposition tool 102 conformally deposits the material of the spacer layers 422 on the sidewalls and top surface of the gate structure 416, and on the top surface of the gate oxide layer 418. The etch tool 108 may subsequently perform an etch back operation to remove the material of the spacer layers 422 from the top surface of the gate oxide layer 418 and from the top surface of the gate structure 416. Accordingly, the spacer layers 422 may remain on the sidewalls of the gate structure 416.

Figure 5I:
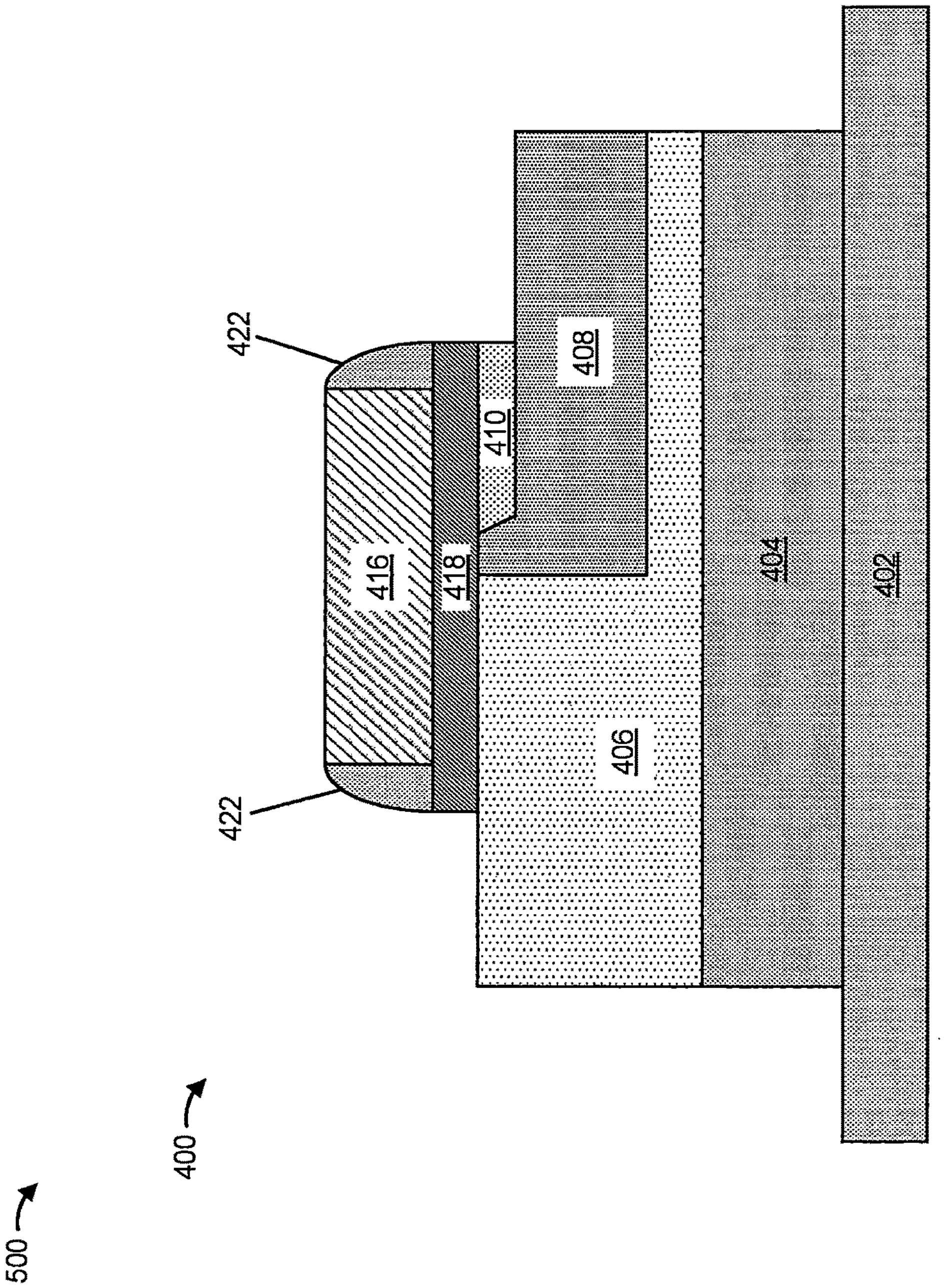

As shown in FIG. 5I, portions of the gate oxide layer 418 and portions of the buffer layer 410 that are not under and/or are not covered by the gate structure 416 and the spacer layers 422 may be removed. The etch tool 108 may perform an etch operation to remove the portions of the gate oxide layer 418 and the portions of the buffer layer 410 such that the gate oxide layer 418 and the buffer layer 410 remain only under the gate structure 416 and the spacer layers 422. In some implementations, the etch operation includes a plasma etch operation, a wet chemical etch operation, and/or another type of etch operation. The etch operation results in rounding of the outer sidewalls of the spacer layers 422, as shown in the example in FIG. 5I.

Figure 5J:
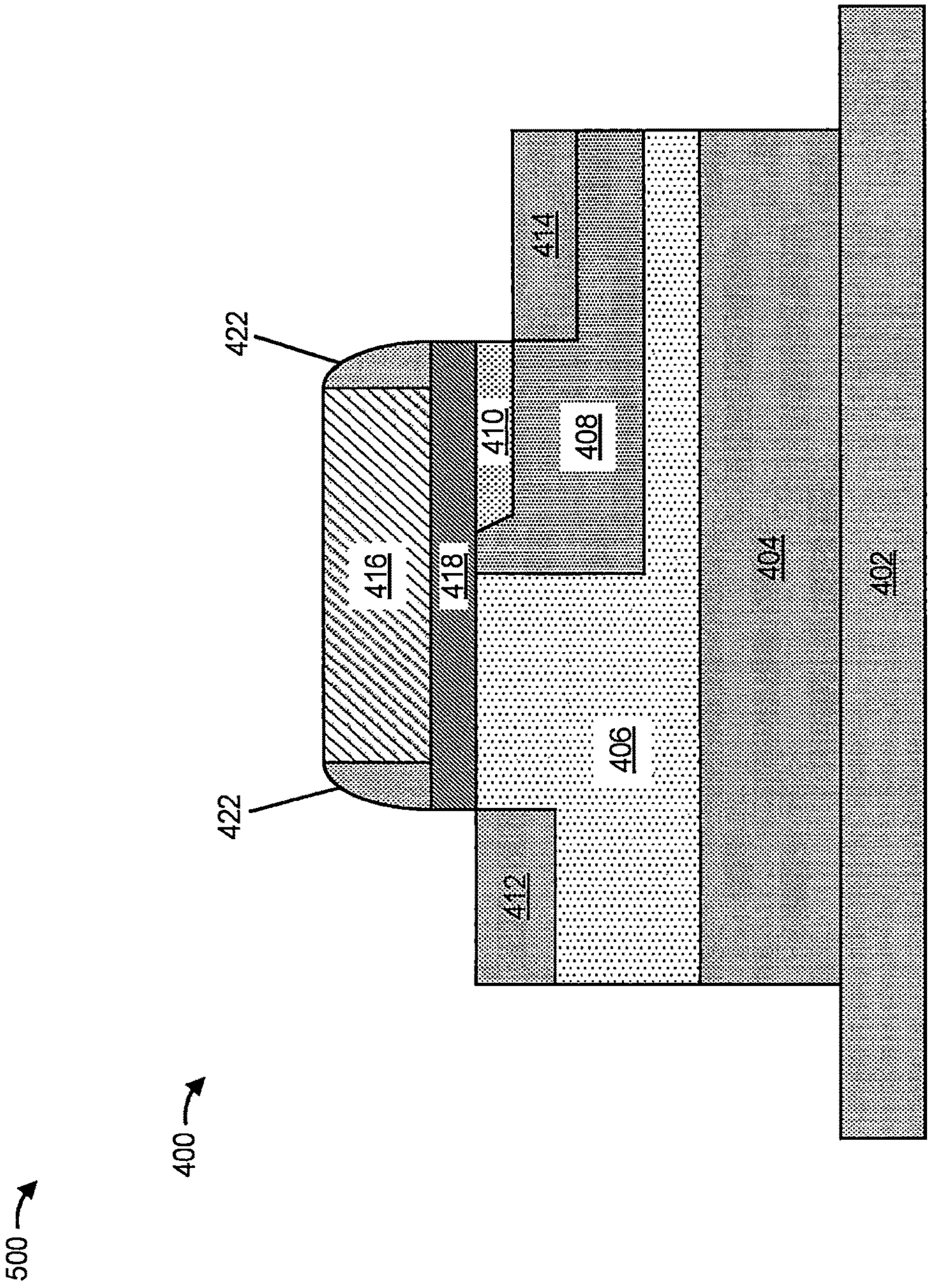

As shown in FIG. 5J, the source/drain region 412 may be formed in the p-well region 406 at a first side of the gate structure 416. The source/drain region 414 may be formed in the NLDD region 408 at a second side of the gate structure 416 opposing the first side. In some implementations, the ion implantation tool 114 forms the source/drain region 412 by performing an ion implantation operation to implant ions (e.g., p-type ions, n-type ions) into the p-well region 406 to form the source/drain region 412 in the p-well region 406. The ion implantation tool 114 may direct an ion beam toward the p-well region 406 such that the ions are implanted in the p-well region 406 to form the source/drain region 412. In some implementations, the ion implantation tool 114 forms the source/drain region 414 by performing an ion implantation operation to implant ions (e.g., p-type ions, n-type ions) into the NLDD region 408 to form the source/drain region 414 in the NLDD region 408. The ion implantation tool 114 may direct an ion beam toward the NLDD region 408 such that the ions are implanted in the p-well region 406 to form the source/drain region 414.

The source/drain regions 412 and 414 may each be formed to include a concentration of dopants that is included in a range of approximately $1E^{14}$ n-type ions per $cm^2$ to approximately $1E^{16}$ n-type ions per $cm^2$ to achieve a sufficiently high on-mode current for the semiconductor device 400, and/or to achieve a sufficiently low off-mode current leakage for the semiconductor device 400. However, other values for these ranges are within the scope of the present disclosure.

Figure 5K:
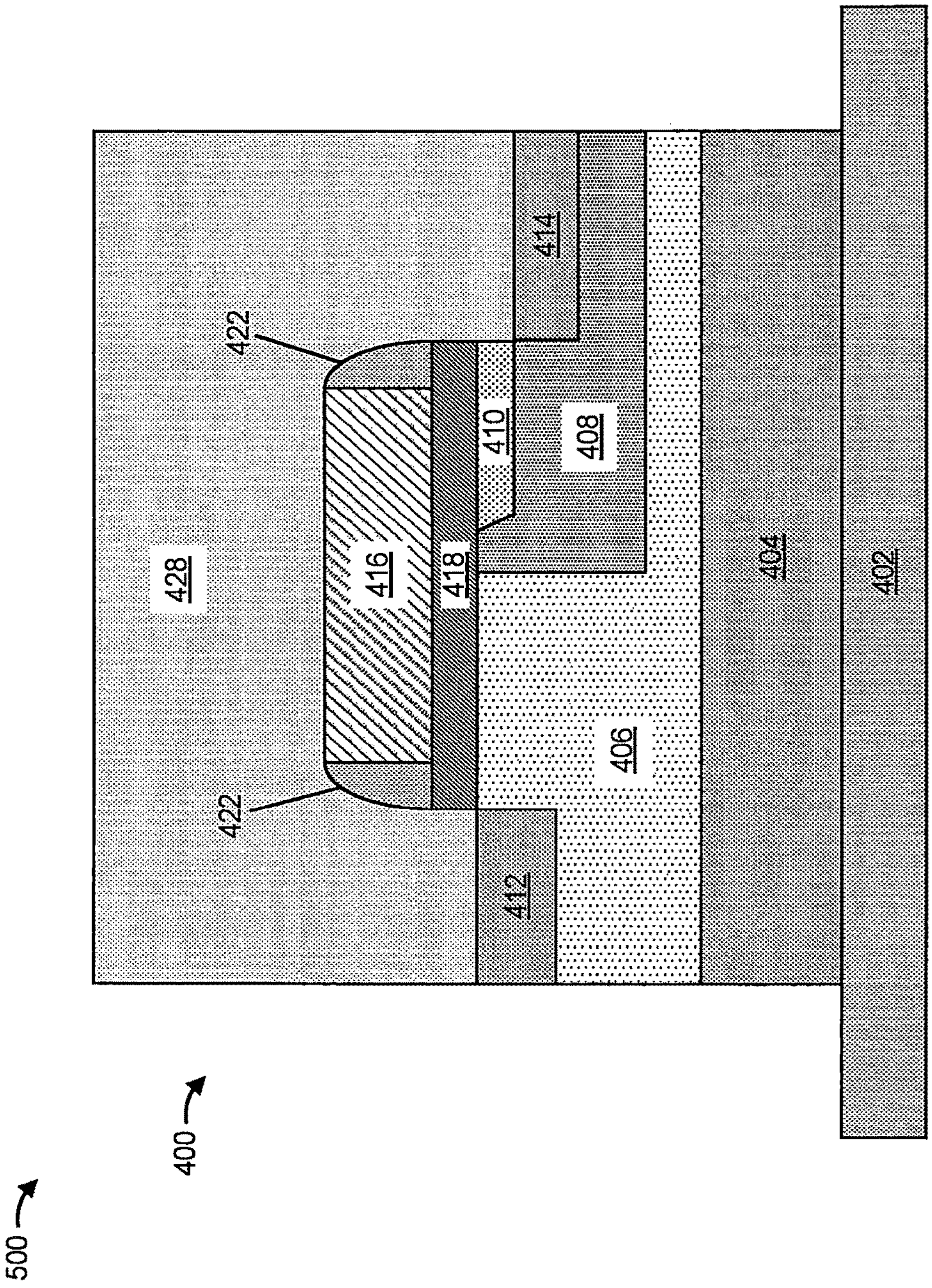

As shown in FIG. 5K, the ILD layer 428 may be formed over and/or on the source/drain regions 412 and 414, over and/or on the gate structure 416, and/or over and/or on the gate structure 416, among other examples. The deposition tool 102 may deposit the ILD layer 428 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the ILD layer 428 after the deposition tool 102 deposits the ILD layer 428.

Figure 5L:
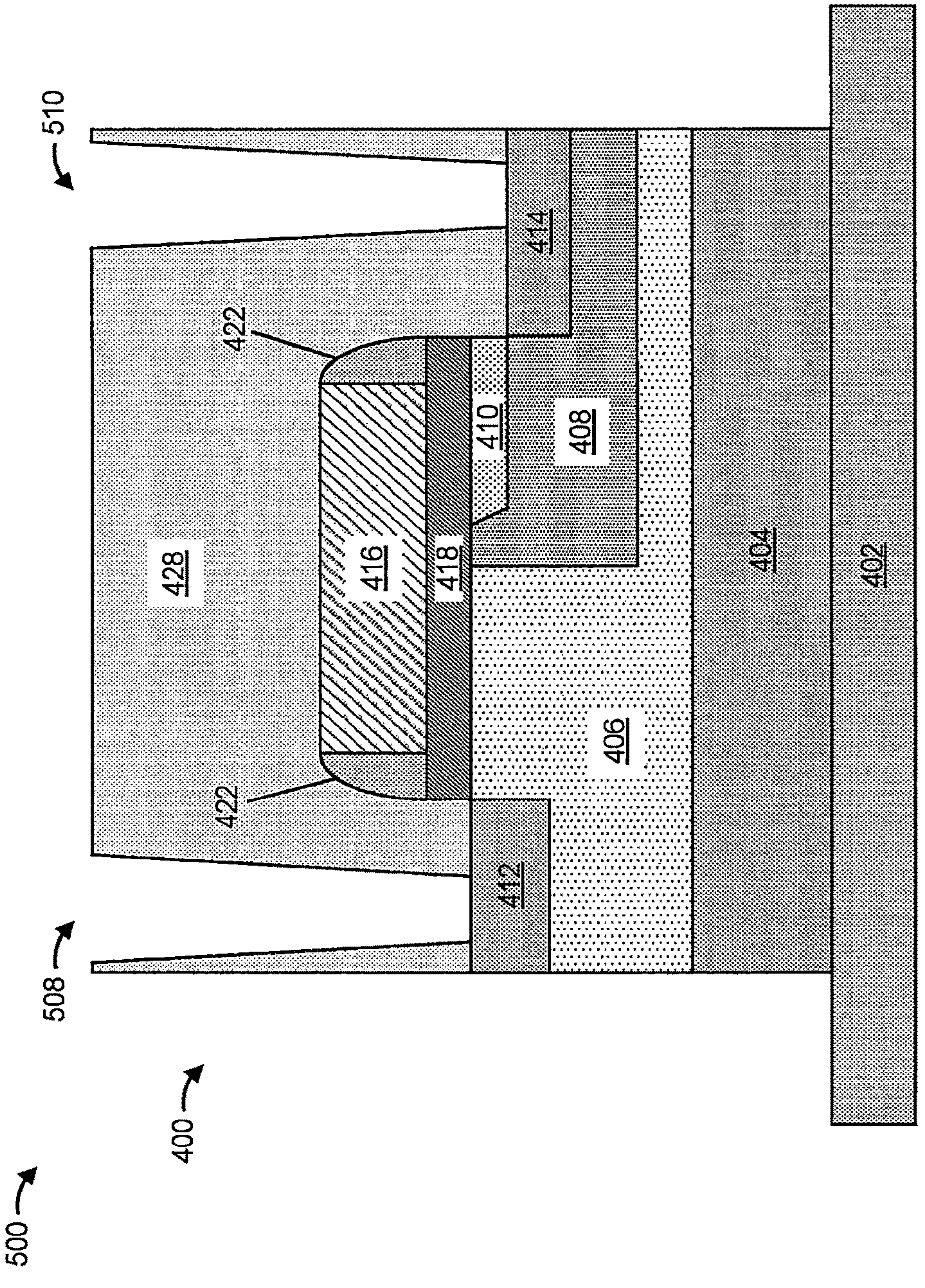

As shown in FIG. 5L, a recess 508 may be formed in and/or through the ILD layer 428 to the top surface of the source/drain region 412. The top surface of the source/drain region 412 is exposed through the recess 508. Alternatively, in implementations in which one or more silicide layers (e.g., a metal silicide layer such as a titanium silicide layer) are included on the source/drain region 412 to reduce contact resistance for the source/drain region 412, the recess 508 may be formed to the one or more silicide layers such that the one or more silicide layers are exposed through the recess 508.

In some implementations, a pattern in a photoresist layer is used to etch the ILD layer 428 to form the recess 508. In these implementations, the deposition tool 102 forms the photoresist layer on the ILD layer 428. The exposure tool 104 exposes the photoresist layer to a radiation source to pattern the photoresist layer. The developer tool 106 develops and removes portions of the photoresist layer to expose the pattern. The etch tool 108 etches the ILD layer 428 based on the pattern to form the recess 508 in the ILD layer 428. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the ILD layer 428 based on a pattern. In some implementations, a photoresist removal tool removes the remaining portions of the photoresist layer (e.g., using a chemical stripper, plasma ashing, and/or another technique).

As further shown in FIG. 5L, a recess 510 may be formed in and/or through the ILD layer 428 to the top surface of the source/drain region 414. The top surface of the source/drain region 414 is exposed through the recess 510. Alternatively, in implementations in which one or more silicide layers (e.g., a metal silicide layer such as a titanium silicide layer) are included on the source/drain region 414 to reduce contact resistance for the source/drain region 414, the recess 510 may be formed to the one or more silicide layers such that the one or more silicide layers are exposed through the recess 510.

In some implementations, a pattern in a photoresist layer is used to etch the ILD layer 428 to form the recess 510. In these implementations, the deposition tool 102 forms the photoresist layer on the ILD layer 428. The exposure tool 104 exposes the photoresist layer to a radiation source to pattern the photoresist layer. The developer tool 106 develops and removes portions of the photoresist layer to expose the pattern. The etch tool 108 etches the ILD layer 428 based on the pattern to form the recess 510 in the ILD layer 428. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the ILD layer 428 based on a pattern. In some implementations, a photoresist removal tool removes the remaining portions of the photoresist layer (e.g., using a chemical stripper, plasma ashing, and/or another technique).

Figure 5M:
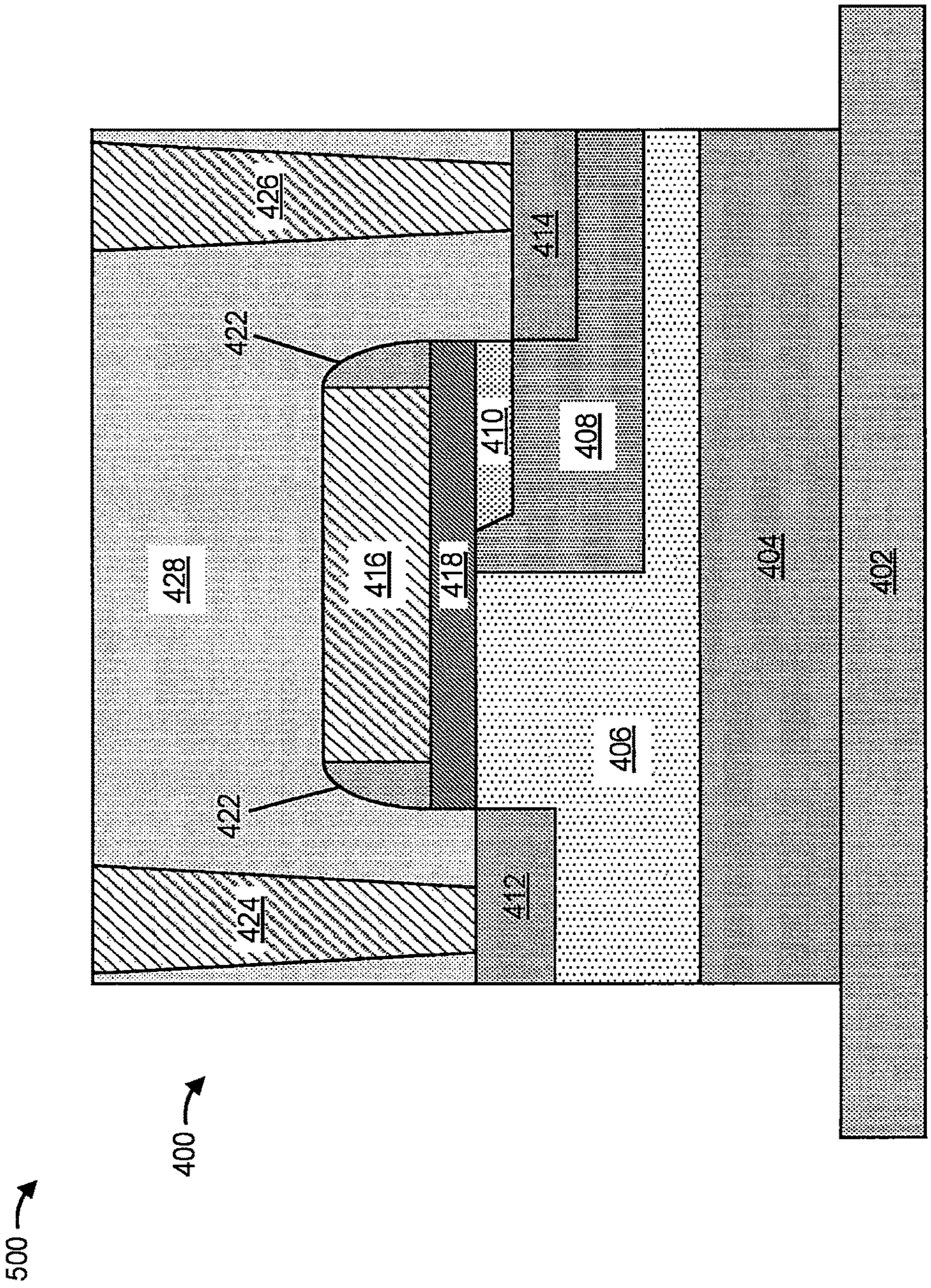

As shown in FIG. 5M, the contact structure 424 may be formed in the recess 508 such that the contact structure 424 lands on the source/drain region 412 (or on the one or more silicide layers included on the source/drain region 412). The contact structure 426 may be formed in the recess 510 such that the contact structure 426 lands on the source/drain region 414 (or on the one or more silicide layers included on the source/drain region 414).

The deposition tool 102 and/or the plating tool 112 may deposit the contact structures 424 and/or 426 in a CVD operation, a PVD operation, an ALD operation, an electroplating operation, another deposition operation described above in connection with FIG. 1, and/or another suitable deposition operation. In some implementations, a seed layer is first deposited, and the contact structures 424 and/or 426 is deposited on the seed layer. In some implementations, the planarization tool 110 planarizes the contact structures 424 and/or 426 after the deposition tool 102 and/or the plating tool 112 deposits the contact structures 424 and/or 426.

As indicated above, FIGS. 5A-5M are provided as an example. Other examples may differ from what is described with regard to FIGS. 5A-5M.

Figure 6:
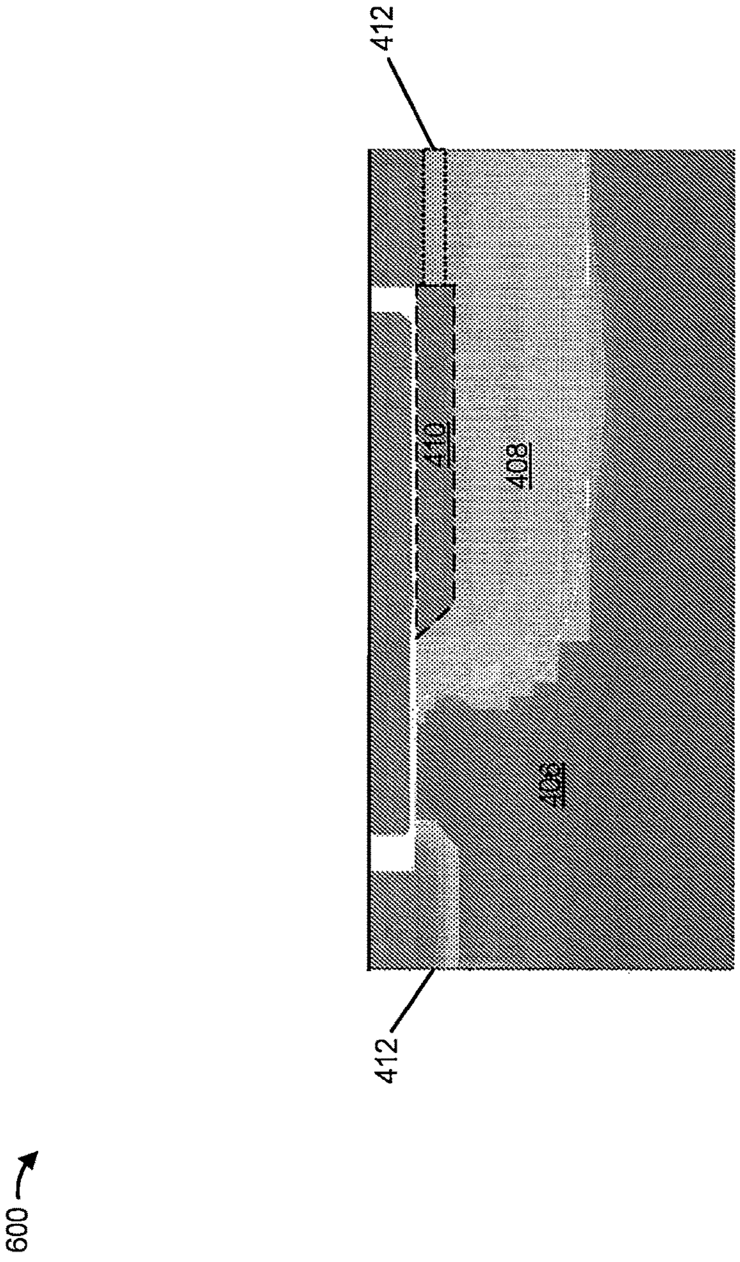
FIG. 6 is a diagram of an example implementation of a doping profile for a portion of the semiconductor device described herein.

FIG. 6 is a diagram of an example implementation 600 of a doping profile for a portion of the semiconductor device 400 described herein.

In some implementations, the p-well region 406 may include a p-type doping profile, whereas the NLDD region 408 and the source/drain regions 412 and 414 may include an n-type doping profile. Alternatively, the p-well region 406 may be an n-well region that includes an n-type doping profile, and the NLDD region 408 and the source/drain regions 412 and 414 may include a p-type doping profile. The buffer layer 410 may include an undoped oxide material such as a high-temperature oxide (HTO).

The concentration of dopants in the source/drain regions 412 and 414 may be greater relative to the concentration of dopants in the NLDD region 408. For example, the NLDD region 408 may be "lightly-doped" in that the NLDD region 408 may include a concentration of dopants that is included in a range of approximately $1E^{11}$ n-type ions per $cm^2$ to approximately $5E^{13}$ n-type ions per $cm^2$, whereas the source/drain regions 412 and 414 may each include a concentration of dopants that is included in a range of approximately $1E^{14}$ n-type ions per $cm^2$ to approximately $1E^{16}$ n-type ions per $cm^2$.

The NLDD region 408 may include a concentration of dopants that is included in a range of approximately $1E^{11}$ n-type ions per $cm^2$ to approximately $5E^{13}$ n-type ions per $cm^2$ to achieve a sufficiently high on-mode current for the semiconductor device 400, and/or to achieve a sufficiently low off-mode current leakage for the semiconductor device 400. However, other values for the range are within the scope of the present disclosure.

The source/drain regions 412 and 414 may each include a concentration of dopants that is included in a range of approximately $1E^{14}$ n-type ions per $cm^2$ to approximately $1E^{16}$ n-type ions per $cm^2$ to achieve a sufficiently high on-mode current for the semiconductor device 400, and/or to achieve a sufficiently low off-mode current leakage for the semiconductor device 400. However, other values for these ranges are within the scope of the present disclosure.

In some implementations, the concentration of dopants in the p-well region 406 may be included in a range of approximately $1E^{11}$ p-type ions per $cm^2$ to approximately $5E^{13}$ p-type ions per $cm^2$. However, other values for the range are within the scope of the present disclosure.

As indicated above, FIG. 6 is provided as an example. Other examples may differ from what is described with regard to FIG. 6.

Figure 7:
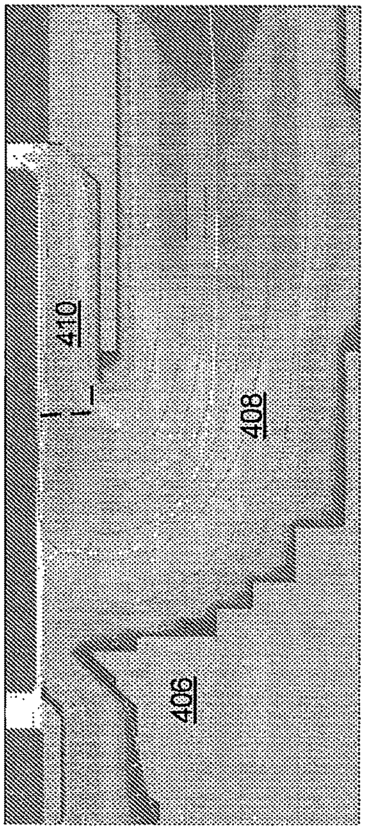
FIG. 7 is a diagram of an example implementation of a current flow pattern for the semiconductor device described herein.

FIG. 7 is a diagram of an example implementation 700 of a current flow pattern for the semiconductor device 400 described herein. The current flow in the semiconductor device 400 may generally flow between the source/drain regions 412 and 414 and under the gate structure 416. The current flow may flow through a portion of the p-well region 406 and through the NLDD region 408. In some implementations, a drain saturation current ($I_{d,sat}$) for the semiconductor device 400 may be approximately 4 times greater relative to a drain saturation current for another semiconductor device that does not include the NLDD region 408 and the buffer layer 410. For example, the drain saturation current for the semiconductor device 400 may be approximately 44 microamps per micron, whereas the drain saturation current for another semiconductor device that does not include the NLDD region 408 and the buffer layer 410 may be approximately 11.1 microamps per micron. However, other values are within the scope of the present disclosure. In some implementations, an off-state breakdown voltage ($BV_{off}$) for the semiconductor device 400 may be greater relative to an off-state breakdown voltage for another semiconductor device that does not include the NLDD region 408 and the buffer layer 410. For example, the off-state breakdown voltage for the semiconductor device 400 may be approximately 12.5 volts, whereas the off-state breakdown voltage for other semiconductor device that does not include the NLDD region 408 and the buffer layer 410 may be approximately 10.8 volts. However, other values are within the scope of the present disclosure.

As indicated above, FIG. 7 is provided as an example. Other examples may differ from what is described with regard to FIG. 7.

Figure 8:
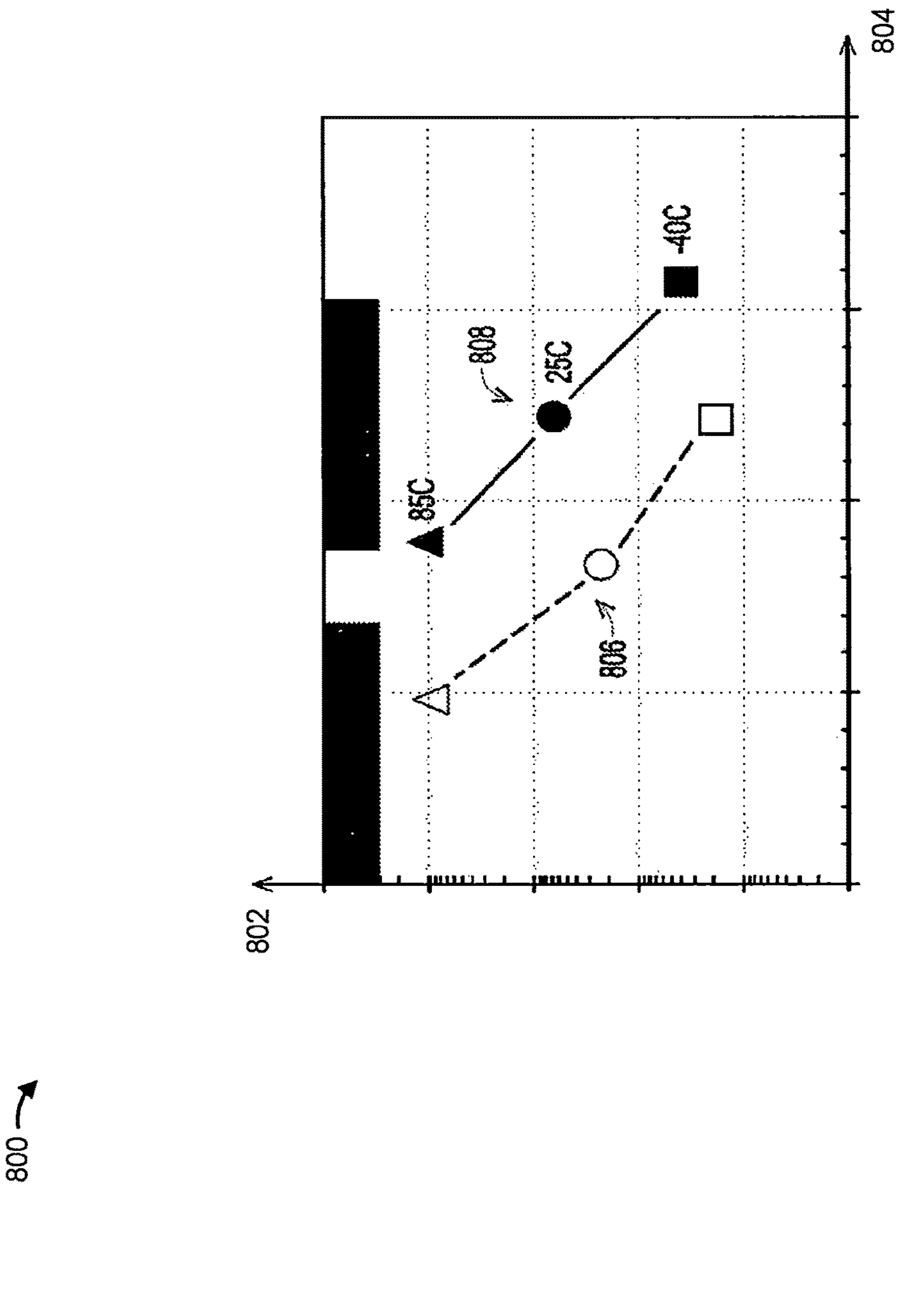
FIG. 8 is a diagram of an example implementation of an off current for the semiconductor device described herein.

FIG. 8 is a diagram of an example implementation 800 of off current profiles for a plurality of semiconductor devices. The off current profiles are illustrated in FIG. 8 as a function of off current ($I_{off}$) 802 (in picoamps per micron) and voltage threshold saturation voltage ($V_{t,sat}$) 804 (in volts). The off current profiles include an off current profile 806 for the semiconductor device 400 described herein, and an off current profile 808 for another semiconductor device that does not include the NLDD region 408 and the buffer layer 410 that is included in the semiconductor device 400.

The off current 802 may correspond to the amount of current that flows through the channel of the semiconductor device 400 when the semiconductor device 400 is "off" (e.g., when the channel is in a non-conductive configuration), and similarly for the other semiconductor device that does not include the NLDD region 408 and the buffer layer 410. The voltage threshold saturation voltage 804 may correspond to the gate voltage ($V_G$) at which the channel of the semiconductor device 400 starts to saturate when the semiconductor device 400 is "on," and similarly for the other semiconductor device that does not include the NLDD region 408 and the buffer layer 410. The semiconductor device 400 may be configured to operate based on a gate voltage of approximately 0.7 volts, whereas the other semiconductor device that does not include the NLDD region 408 and the buffer layer 410 may be configured to operate based on a gate voltage of approximately 0.9 volts. However, other values are within the scope of the present disclosure.

As shown in FIG. 8, the off current 802 in the off current profiles 806 and 808 are generally greater at higher operating temperatures and lesser at lower operating temperatures. Moreover, the voltage threshold saturation voltages 804 in the off current profiles 806 and 808 are generally greater at lower operating temperatures and lesser at higher operating temperatures.

As further shown in FIG. 8, the NLDD region 408 and the buffer layer 410 that is included in the semiconductor device 400 enables the semiconductor device 400 to operate using a lower voltage threshold saturation voltage 804 relative to the other semiconductor device that does not include the NLDD region 408 and the buffer layer 410, while enabling the semiconductor device 400 to achieve approximately the same or lesser off current 802 relative to the other semiconductor device that does not include the NLDD region 408 and the buffer layer 410.

In some implementations, the voltage threshold saturation voltage 804 for the semiconductor device 400 may be as low as approximately 0.37 volts or less, whereas the voltage threshold saturation voltage 804 for the other semiconductor device that does not include the NLDD region 408 and the buffer layer 410 may be approximately 0.445 volts. However, other values are within the scope of the present disclosure. In some implementations, the off current 802 for the semiconductor device 400 may be as low as approximately 2 picoamps per micron or less, whereas the off current 802 for the other semiconductor device that does not include the NLDD region 408 and the buffer layer 410 may be approximately 6.3 picoamps per micron. However, other values are within the scope of the present disclosure.

As indicated above, FIG. 8 is provided as an example. Other examples may differ from what is described with regard to FIG. 8.

Figure 9:
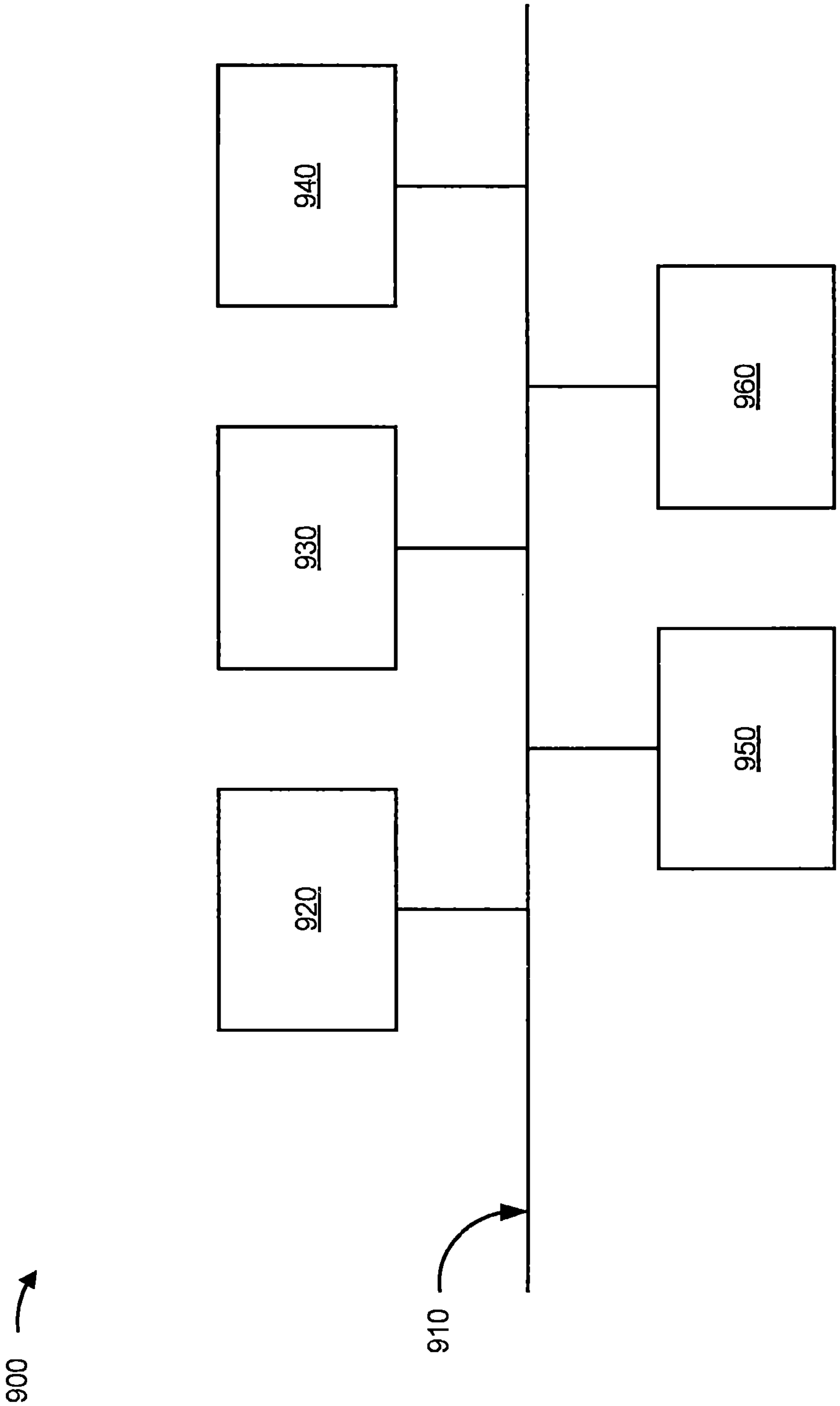
FIG. 9 is a diagram of example components of a device described herein.

FIG. 9 is a diagram of example components of a device 900 described herein. In some implementations, one or more of the semiconductor processing tools 102-114 and/or the wafer/die transport tool 116 may include one or more devices 900 and/or one or more components of the device 900. As shown in FIG. 9, the device 900 may include a bus 910, a processor 920, a memory 930, an input component 940, an output component 950, and/or a communication component 960.

The bus 910 may include one or more components that enable wired and/or wireless communication among the components of the device 900. The bus 910 may couple together two or more components of FIG. 9, such as via operative coupling, communicative coupling, electronic coupling, and/or electric coupling. For example, the bus 910 may include an electrical connection (e.g., a wire, a trace, and/or a lead) and/or a wireless bus. The processor 920 may include a central processing unit, a graphics processing unit, a microprocessor, a controller, a microcontroller, a digital signal processor, a field-programmable gate array, an application-specific integrated circuit, and/or another type of processing component. The processor 920 may be implemented in hardware, firmware, or a combination of hardware and software. In some implementations, the processor 920 may include one or more processors capable of being programmed to perform one or more operations or processes described elsewhere herein.

The memory 930 may include volatile and/or nonvolatile memory. For example, the memory 930 may include random access memory (RAM), read only memory (ROM), a hard disk drive, and/or another type of memory (e.g., a flash memory, a magnetic memory, and/or an optical memory). The memory 930 may include internal memory (e.g., RAM, ROM, or a hard disk drive) and/or removable memory (e.g., removable via a universal serial bus connection). The memory 930 may be a non-transitory computer-readable medium. The memory 930 may store information, one or more instructions, and/or software (e.g., one or more software applications) related to the operation of the device 900. In some implementations, the memory 930 may include one or more memories that are coupled (e.g., communicatively coupled) to one or more processors (e.g., processor 920), such as via the bus 910. Communicative coupling between a processor 920 and a memory 930 may enable the processor 920 to read and/or process information stored in the memory 930 and/or to store information in the memory 930.

The input component 940 may enable the device 900 to receive input, such as user input and/or sensed input. For example, the input component 940 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 950 may enable the device 900 to provide output, such as via a display, a speaker, and/or a light-emitting diode. The communication component 960 may enable the device 900 to communicate with other devices via a wired connection and/or a wireless connection. For example, the communication component 960 may include a receiver, a transmitter, a transceiver, a modem, a network interface card, and/or an antenna.

The device 900 may perform one or more operations or processes described herein. For example, a non-transitory computer-readable medium (e.g., memory 930) may store a set of instructions (e.g., one or more instructions or code) for execution by the processor 920. The processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry may be used instead of or in combination with the instructions to perform one or more operations or processes described herein. Additionally, or alternatively, the processor 920 may be configured to perform one or more operations or processes described herein. Thus, implementations described herein are not limited to any specific combination of hardware circuitry and software.

The number and arrangement of components shown in FIG. 9 are provided as an example. The device 900 may include additional components, fewer components, different components, or differently arranged components than those shown in FIG. 9. Additionally, or alternatively, a set of components (e.g., one or more components) of the device 900 may perform one or more functions described as being performed by another set of components of the device 900.

Figure 10:
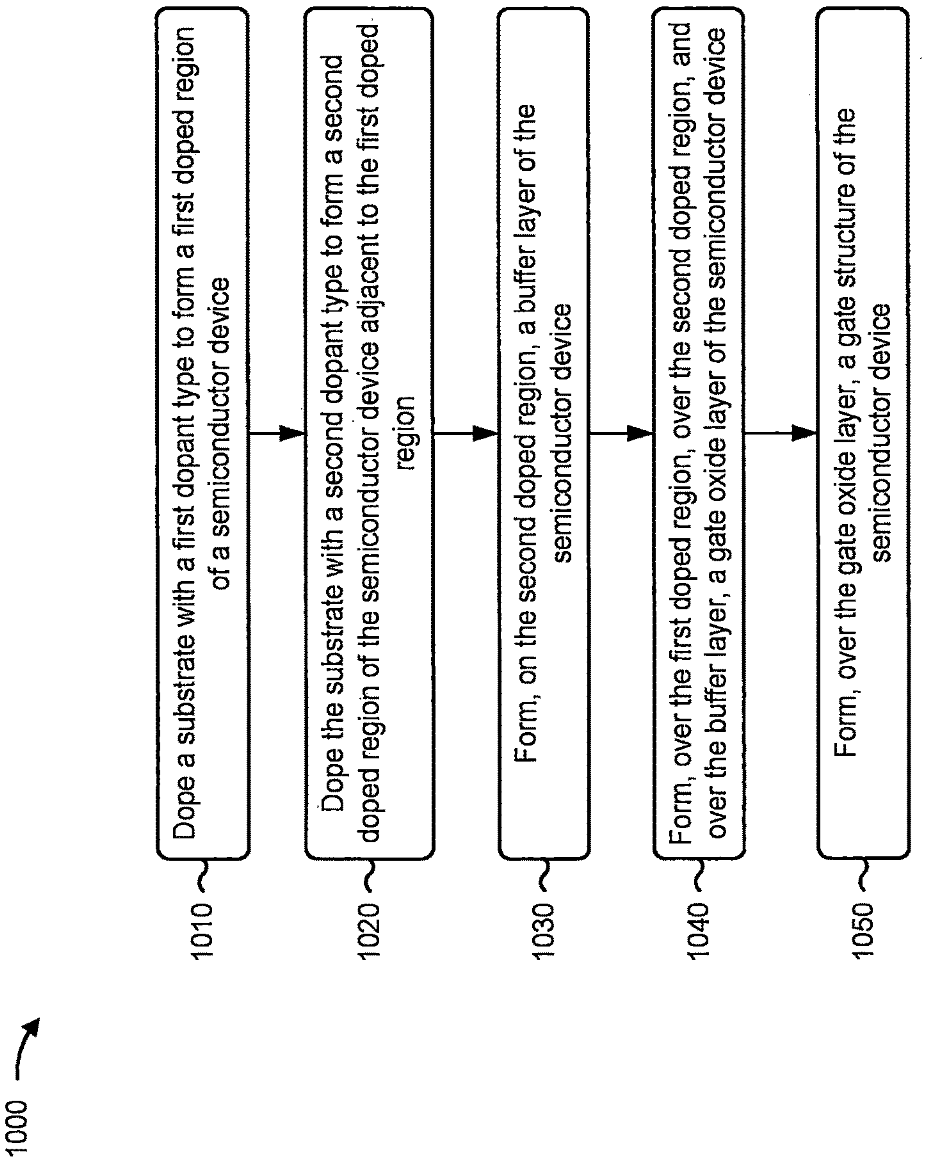
FIG. 10 is a flowchart of an example process associated with forming a transistor structure described herein.

FIG. 10 is a flowchart of an example process 1000 associated with forming a transistor structure described herein. In some implementations, one or more process blocks of FIG. 10 are performed by one or more semiconductor processing tools (e.g., one or more of the semiconductor processing tools 102-116). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include doping a substrate with a first dopant type to form a first doped region of a semiconductor device (block 1010). For example, one or more of the semiconductor processing tools 102-116 may dope a substrate 402 with a first dopant type to form a first doped region (e.g., a p-well region 406) of a semiconductor device 400, as described herein. In some implementations, the first doped region includes a first dopant type (e.g., a p-type dopant).

As further shown in FIG. 10, process 1000 may include doping the substrate with a second dopant type to form a second doped region of the semiconductor device adjacent to the first doped region (block 1020). For example, one or more of the semiconductor processing tools 102-116 may dope the substrate 402 with a second dopant type to form a second doped region (e.g., an NLDD region 408) of the semiconductor device 400 adjacent to the first doped region, as described herein. In some implementations, the second dope region includes a second dopant type (e.g., an n-type dopant).

As further shown in FIG. 10, process 1000 may include forming, on the second doped region, a buffer layer of the semiconductor device (block 1030). For example, one or more of the semiconductor processing tools 102-116 may form, on the second doped region, a buffer layer 410 of the semiconductor device 400, as described herein.

As further shown in FIG. 10, process 1000 may include forming, over the first doped region, over the second doped region, and over the buffer layer, a gate oxide layer 418 of the semiconductor device (block 1040). For example, one or more of the semiconductor processing tools 102-116 may form, over the first doped region, over the second doped region, and over the buffer layer 410, a gate oxide layer 418 of the semiconductor device 400, as described herein.

As further shown in FIG. 10, process 1000 may include forming, over the gate oxide layer, a gate structure of the semiconductor device (block 1050). For example, one or more of the semiconductor processing tools 102-116 may form, over the gate oxide layer 418, a gate structure 416 of the semiconductor device, as described herein.

Process 1000 may include additional implementations, such as any single implementation or any combination of implementations described below and/or in connection with one or more other processes described elsewhere herein.

In a first implementation, forming the buffer layer 410 includes forming a masking layer 502 over the first doped region and over the second doped region, forming a pattern in the masking layer 502, and forming the buffer layer 410 based on the pattern in the masking layer.

In a second implementation, alone or in combination with the first implementation, a first portion 504 of the second doped region is exposed through the pattern, and wherein a second portion 506 of the second doped region remains covered by the masking layer 502 when the buffer layer 410 is formed.

In a third implementation, alone or in combination with one or more of the first and second implementations, the second portion 506 of the second doped region corresponds to an extension region 420 of the second doped region, where the buffer layer 410 is in contact with a first side of the extension region 420, and where the first doped region is in contact with a second side of the extension region 420 opposing the first side.

In a fourth implementation, alone or in combination with one or more of the first through third implementations, forming the buffer layer based on the pattern comprises etching a portion of the second doped region based on the pattern, and depositing the buffer layer in an area that was occupied by the portion of the second doped region.

In a fifth implementation, alone or in combination with one or more of the first through fourth implementations, process 1000 includes performing one or more etch operations, based on the gate structure 416, to remove a first portion of the gate oxide layer 418 and to remove a first portion of the buffer layer 410, a second portion of the gate oxide layer 418 remains under the gate structure 416, and where a second portion of the buffer layer 410 remains under the gate structure 416.

In a sixth implementation, alone or in combination with one or more of the first through fifth implementations, process 1000 includes performing an etch operation to remove the masking layer 502, where the etch operation results in a top surface of the buffer layer 410 and a top surface of the first doped region being approximately coplanar.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

In this way, a medium voltage transistor of a level shifter circuit may include a p-well region in a substrate. Moreover, the medium voltage transistor may include an NLDD region in which an $N^+$ source/drain region of the medium voltage transistor is included. The light doping in the NLDD region enables a threshold voltage ($V_t$) to be reduced while enabling medium voltage operation at the $N^+$ source/drain region. To reduce the amount and/or likelihood of current leakage in the medium voltage transistor due to the light doping in the NLDD region, a buffer layer may be included over and/or on a portion of the NLDD region under a gate structure of the medium voltage transistor. The NLDD region and the thermal region of the medium voltage transistor enables the threshold voltage of the medium voltage transistor (e.g., relative to a medium voltage transistor that does not include the NLDD region and the thermal region) while maintaining the same current leakage performance or reducing current leakage in the medium voltage transistor (e.g., relative to a medium voltage transistor that does not include the NLDD region and the thermal region). This may enable the medium voltage transistor may be operated by the low voltage (core $V_{dd}$) of low voltage transistors included in the level shifter circuit. Moreover, this may enable the low voltage of the low voltage transistors included in the level shifter circuit to be reduced, which may reduce the power consumption of the level shifter circuit.

As described in greater detail above, some implementations described herein provide a semiconductor device. The semiconductor device includes a first doped region that includes a first dopant type. The semiconductor device includes a second doped region, in the first doped region, that includes a second dopant type. The semiconductor device includes a third doped region, in the first doped region, that includes the second dopant type, where the third doped region corresponds to a first source/drain region of the semiconductor device. The semiconductor device includes a fourth doped region, in the second doped region, that includes the second dopant type, where the fourth doped region corresponds to a second source/drain region of the semiconductor device. The semiconductor device includes a buffer layer over a portion of second doped region. The semiconductor device includes a gate oxide layer over a portion of the first doped region, over the buffer layer, and over an extension region of the second doped region. The semiconductor device includes a gate structure over the gate oxide layer.

As described in greater detail above, some implementations described herein provide a method. The method includes forming, over a substrate, a first doped region of a semiconductor device, where the first doped region includes a first dopant type. The method includes forming, in the first doped region, a second doped region of the semiconductor device, where the second dope region includes a second dopant type. The method includes forming, over the second doped region, a buffer layer of the semiconductor device. The method includes forming, over the first doped region, over the second doped region, and over the buffer layer, a gate oxide layer of the semiconductor device. The method includes forming, over the gate oxide layer, a gate structure of the semiconductor device.

As described in greater detail above, some implementations described herein provide a level shifter circuit. The level shifter circuit includes an inverter circuit electrically coupled with an input. The level shifter circuit includes a plurality of n-type transistors, comprising, a first n-type transistor electrically coupled with the inverter circuit a second n-type transistor electrically coupled with the input. The level shifter circuit includes a plurality of p-type transistors electrically coupled with the plurality of n-type transistors, where at least one of the plurality of n-type transistors or at least one of the plurality of p-type transistors comprises: a gate oxide layer a first doped region, under the gate oxide layer, that includes a first dopant type a lightly-doped second doped region, under the gate oxide layer and side by side with the first doped region, that includes a second dopant type a buffer layer, under the gate oxide layer and side by side with the lightly-doped second doped region.

As described in greater detail above, some implementations described herein provide a semiconductor device. The semiconductor device includes a first doped region comprising a first dopant type in a substrate. The semiconductor device includes a second doped region comprising a second dopant type in the substrate and adjacent to the first doped region. The semiconductor device includes a first source/drain region comprising the second dopant type in the substrate and on the first doped region. The semiconductor device includes a second source/drain region comprising the second dopant type in the substrate and on the second doped region. The semiconductor device includes a buffer layer over a portion of the second doped region. The semiconductor device includes a gate oxide layer over a portion of the first doped region, over the buffer layer, and over an extension region of the second doped region. The semiconductor device includes a gate structure over the gate oxide layer.

As described in greater detail above, some implementations described herein provide a method. The method includes doping a substrate with a first dopant type to form a first doped region of a semiconductor device. The method includes doping the substrate with a second dopant type to form a second doped region of the semiconductor device adjacent to the first doped region. The method includes forming, on the second doped region, a buffer layer of the semiconductor device. The method includes forming, over the first doped region, over the second doped region, and over the buffer layer, a gate oxide layer of the semiconductor device. The method includes forming, over the gate oxide layer, a gate structure of the semiconductor device.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

doping a substrate with a first dopant type to form a first doped region of a semiconductor device;

doping the substrate with a second dopant type to form a second doped region of the semiconductor device adjacent to the first doped region;

forming, on the second doped region, a buffer layer of the semiconductor device;

forming, over the first doped region, over the second doped region, and over the buffer layer, a gate oxide layer of the semiconductor device;

forming, over the gate oxide layer, a gate structure of the semiconductor device; and performing one or more etch operations, based on the gate structure, to remove a first portion of the gate oxide layer and to remove a first portion of the buffer layer, wherein a second portion of the gate oxide layer remains under the gate structure, and wherein a second portion of the buffer layer remains under the gate structure.

2. The method of claim 1, wherein forming the buffer layer comprises:

forming a masking layer over the first doped region and over the second doped region;

forming a pattern in the masking layer; and forming the buffer layer based on the pattern in the masking layer.

3. The method of claim 2, wherein a first portion of the second doped region is exposed through the pattern; and wherein a second portion of the second doped region remains covered by the masking layer when the buffer layer is formed.

4. The method of claim 3, wherein the second portion of the second doped region corresponds to an extension region of the second doped region;

wherein the buffer layer is in contact with a first side of the extension region; and wherein the first doped region is in contact with a second side of the extension region opposing the first side.

5. The method of claim 2, wherein forming the buffer layer based on the pattern comprises:

etching a portion of the second doped region based on the pattern; and depositing the buffer layer in an area that was occupied by the portion of the second doped region.

6. The method of claim 2, further comprising:

performing an etch operation to remove the masking layer, wherein the etch operation results in a top surface of the buffer layer and a top surface of the first doped region being approximately co-planar.

7. A method, comprising:

forming a first doped region, comprising a first dopant type, in a substrate;

forming a second doped region, comprising a second dopant type, in the substrate and adjacent to the first doped region;

forming a first source/drain region, comprising the second dopant type, in the substrate and on the first doped region;

forming a second source/drain region, comprising the second dopant type, in the substrate and on the second doped region;

forming a buffer layer over a portion of the second doped region;

forming a gate oxide layer over a portion of the first doped region, over the buffer layer, and over an extension region of the second doped region;

forming a gate structure over the gate oxide layer; and performing one or more etch operations, based on the gate structure, to remove a first portion of the gate oxide layer and to remove a first portion of the buffer layer, wherein a second portion of the gate oxide layer remains under the gate structure, and wherein a second portion of the buffer layer remains under the gate structure.

8. The method of claim 7, wherein a dopant concentration of the second dopant type in the second doped region is lesser relative to a dopant concentration of the second dopant type in the first source/drain region.

9. The method of claim 7, wherein the buffer layer is in contact with the gate oxide layer on a first side of the buffer layer; and wherein the buffer layer is in contact with the portion of the second doped region on a second side of the buffer layer opposing the first side.

10. The method of claim 9, wherein the buffer layer is in contact with the extension region of the second doped region on a third side of the buffer layer.

11. The method of claim 7, wherein the extension region of the second doped region is between the first doped region and the buffer layer under the gate oxide layer.

12. The method of claim 7, wherein the extension region of the second doped region is in contact with the gate oxide layer.

13. The method of claim 7, wherein the second source/drain region is configured to operate at a greater operational voltage relative to an operational voltage of the gate structure.

14. A method, comprising:

forming, in a substrate, a first doped region and a second doped region adjacent to the first doped region;

forming a buffer layer over at least a portion of the second doped region;

forming a gate oxide layer over the first doped region, over the second doped region, and over the buffer layer;

forming a gate structure on the gate oxide layer; and performing one or more etch operations, based on the gate structure, to remove a first portion of the gate oxide layer and to remove a first portion of the buffer layer, wherein a second portion of the gate oxide layer remains under the gate structure, and wherein a second portion of the buffer layer remains under the gate structure.

15. The method of claim 14, wherein forming the buffer layer comprises forming the buffer layer to a thickness in a range of approximately 10 nanometers to approximately 100 nanometers.

16. The method of claim 14, wherein the buffer layer comprises silicon oxide, silicon oxynitride, or silicon nitride.

17. The method of claim 14, wherein the gate oxide layer is formed to a thickness in a range of approximately 150 angstroms to approximately 300 angstroms.

18. The method of claim 14, further comprising forming a spacer layer on sidewalls of the gate structure after forming the gate structure.

19. The method of claim 14, wherein the buffer layer is beneath the gate structure at a thickness that is greater than a thickness of a portion of the gate oxide layer formed directly on the first doped region.

20. The method of claim 1, wherein an extension region of the second doped region is between the first doped region and the buffer layer under the gate oxide layer.

* * * * *